(12) United States Patent
Karashima et al.

(10) Patent No.: US 7,799,607 B2
(45) Date of Patent: *Sep. 21, 2010

(54) PROCESS FOR FORMING BUMPS AND SOLDER BUMP

(75) Inventors: Seiji Karashima, Osaka (JP); Yoshihisa Yamashita, Kyoto (JP); Satoru Tomekawa, Kanagawa (JP); Takashi Kitae, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 505 days.

This patent is subject to a terminal disclaimer.

(21) Appl. No.: 11/661,821

(22) PCT Filed: Aug. 30, 2005

(86) PCT No.: PCT/JP2005/015765

§ 371 (c)(1),
(2), (4) Date: Jun. 1, 2007

(87) PCT Pub. No.: WO2006/025387

PCT Pub. Date: Mar. 9, 2006

(65) Prior Publication Data
US 2007/0257362 A1 Nov. 8, 2007

(30) Foreign Application Priority Data

Sep. 3, 2004 (JP) .............................. 2004-257206
Mar. 28, 2005 (JP) .............................. 2005-091336

(51) Int. Cl.
*H01L 21/44* (2006.01)
(52) U.S. Cl. ...................... 438/108; 438/615
(58) Field of Classification Search ......... 438/106–127, 438/612–617
See application file for complete search history.

(56) References Cited

U.S. PATENT DOCUMENTS 5,062,896 A 11/1991 Huang et al.

(Continued)

FOREIGN PATENT DOCUMENTS

EP 0 450 278 10/1991

(Continued)

OTHER PUBLICATIONS

"*Electronics Packaging Technology*", Sep. 2000, pp. 38-45.

(Continued)

*Primary Examiner*—Savitri Mulpuri
(74) *Attorney, Agent, or Firm*—Wenderoth, Lind & Ponack, L.L.P.

(57) ABSTRACT

A process for forming bumps wherein a plurality of fine bumps are uniformly formed with high productivity. In this process, a resin (13) including solder powder and a convection additive (12) is supplied onto a substrate (10) having a plurality of electrodes (11) thereon. And subsequently the substrate (10) is heated to a temperature that enables the solder powder to melt while keeping a flat plate (14) in contact with a surface of the supplied resin (13). During this heating step, the molten solder powder is allowed to self-assemble onto the electrodes (11) so that a plurality of solder balls, resulting from the grown molten solder powder, are concurrently formed on the electrodes (11) in self-alignment manner. Finally, the flat plate (14) is moved away from the surface of the supplied resin (13), and then the resin (13) is removed to provide a substrate (10) having bumps (16) formed on the plurality of the electrodes.

21 Claims, 12 Drawing Sheets

U.S. PATENT DOCUMENTS

| | | | |
|---|---|---|---|
| 5,145,532 | A | 9/1992 | Fukunaga et al. |
| 5,346,558 | A | 9/1994 | Mathias |
| 7,531,387 | B1 * | 5/2009 | Karashima et al. .......... 438/127 |
| 2001/0008310 | A1 | 7/2001 | Sakuyama et al. |
| 2001/0019075 | A1 | 9/2001 | Abe et al. |
| 2003/0096494 | A1 * | 5/2003 | Sakuyama et al. .......... 438/613 |
| 2006/0027936 | A1 * | 2/2006 | Mizukoshi et al. .......... 257/781 |
| 2006/0030071 | A1 * | 2/2006 | Mizukoshi et al. .......... 438/106 |

FOREIGN PATENT DOCUMENTS

| | | |
|---|---|---|
| EP | 1 615 263 | 1/2006 |
| JP | 1-157796 | 6/1989 |
| JP | 2-251145 | 10/1990 |
| JP | 6-125169 | 5/1994 |
| JP | 7-74459 | 3/1995 |
| JP | 7-235763 | 9/1995 |
| JP | 2000-94179 | 4/2000 |
| JP | 2001-219294 | 8/2001 |
| JP | 2001-329048 | 11/2001 |
| JP | 2002-141367 | 5/2002 |
| JP | 2004-260131 | 9/2004 |

OTHER PUBLICATIONS

Yasuhisa Kaga et al., "*Development of Soldering Technique Through Super Solder*", Technical Report of IEICE, EMD 96-15 (Jun. 1996), pp. 23-31.

Masahiro Yasuda et al., "*Self-Organized Joining Assembly Process by Electrically Conductive Adhesive Using Low Melting Point Fillers*", 10th Symposium on "Microjoining and Assembly Technology in Electronics", Feb. 5-6, 2004, pp. 183-188.

Masahiro Rito et al., "*Assembly Process by Electrically Conductive Adhesive Using Low elting Point Fillers*", 9th Symposium on "Microjoining and Assembly Technology in Electronics", Feb. 6-7, 2003, pp. 115-120.

Kiyokazu Yasuda et al., "*Self-Organized Packaging Using Polymer Containing Low-Melting-Point-Metal Filler Process Simulation of Viscous Multi Phase Flow Fluid*", 11th Symposium on "Microjoining and Assembly Technology in Electronics", Feb. 3-4, 2005, pp. 239-244.

Takayuki Yamada et al., "*Self-Organized Packaging by Polymer Containing Low Melting Point Metal Expermental Verification of Process Rule Factors of Self-Organization*", 11th Symposium on "Microjoining and Assembly Technology in Electronics", Feb. 3-4, 2005, pp. 245-250.

Kouishi Ohta et al., "*Study of Self-Organization Assembly Process Based on Mars Method 3-Dimensional 2-Phase Flow Analysis*", 12th Symposium on "Microjoining and Assembly Technology in Electronics", Feb. 2-3, 2006, pp. 381-386.

Masao Toya et al., "*Experimental Verification of Lateral Flow Effects in Resin Containing Solder Fillers on Self-Organization Joining Process*", MES2006 (Micro Electronics Symposium), pp. 335-338.

Masaru Yamashita et al., "*Analysis Concerning the Coalescence Behavior of Metal Droplet in Self-Organization*", 13th Symposium on "Microjoining and Assembly Technology in Electronics", Feb. 1-2, 2007, pp. 55-60.

Supplementary European Search Report issued Aug. 17, 2009 in corresponding European Patent Application No. 05 77 6918.

* cited by examiner (a)

(b)

(a)

(b)

(a)

B ↓         ↓ B'

(b)

PROCESS FOR FORMING BUMPS AND SOLDER BUMP

BACKGROUND OF THE INVENTION

1. Technical Field of the Invention

The present invention relates to a process for forming bumps on electrodes formed on a substrate. In particular, the present invention relates to a process for forming fine bumps having improved uniformity on electrodes arranged at a fine pitch.

2. Description of the Related Art

With the development of high density and high integration of a semiconductor integrated circuit (LSI) used for electronics device, higher pin count and finer pitch of electrode terminals of a LSI chip have been rapidly developed in recent years. The LSI chip is mounted over a wiring substrate by generally employing a flip chip mounting process in order to decrease wiring delay. It is common practice in this flip chip mounting process to form solder bumps on the electrode terminals of the LSI chip, and then connect, through such solder bumps, all the electrode terminals to all electrodes formed on the wiring substrate in a batch process.

For mounting a next-generation LSI having 5000 or more electrode terminals over the wiring substrate, it is necessary to form fine-pitch bumps with a pitch of 100 µm or less. It is, however, difficult for a conventional solder bump forming process to form such fine-pitch bumps. Moreover, from a viewpoint that a large number of bumps must be formed according to the number of the electrode terminals, high productivity is required to reduce manufacturing cost by reducing mounting tact time per chip.

There has been conventionally developed a plating process and a screen printing process as a bump forming process. The plating process is convenient for achieving the fine pitch, but it is complicated and compromises the productivity. The screen printing process, on the other hand, has high productivity, but is not convenient for achieving the fine pitch because a mask is used.

Recently, there has been developed several processes for selectively forming solder bumps on electrodes of a LSI chip or wiring substrate. These processes are not only convenient for forming fine bumps, but also convenient for achieving a high productivity since a plurality of the fine bumps can be formed in a batch process. Accordingly they are promising processes that can be applicable to the mounting of the next-generation LSI over the wiring substrate.

According to one of these promising processes, a solder paste comprising a mixture of solder powder and a flux is applied directly onto a substrate having electrodes thereon, and subsequently the substrate is heated so as to melt the solder powder and then form the bumps selectively on the electrodes having high wettability without causing an electrical short circuit between the adjacent electrodes. See Japanese Patent Kokai Publication No. 2000-94179 (which is hereinafter referred to also as "Patent literature 1"), for example.

There is also another process wherein a paste composition (so-called "deposition type solder using chemical reaction") mainly comprising organic acid lead salt and tin metal is applied directly onto a substrate, and subsequently the substrate is heated so as to induce a displacement reaction for Pb and Sn, and thereby Pb/Sn alloy is selectively deposited on electrodes of the substrate. See Japanese Patent Kokai Publication No. H01-157796 (which is hereinafter referred to also as "Patent literature 2") and "Electronics Packaging Technology", issued on September 2000, pp. 38-45 (which is hereinafter referred to also as "Non-patent literature 1"), for example.

There is also another process which selectively forms molten solder on electrodes, by immersing a substrate having electrodes thereof in a chemical solution so as to form an adhesive film only on surfaces of the electrodes, and then putting solder powder into contact with the adhesive film so as to attach the solder powder to the electrodes and subsequently heating the substrate. See Japanese Patent Kokai Publication No. H07-74459 (which is hereinafter referred to also as "Patent literature 3") and "Technical Report of IEICE, EMD96-15" (which is hereinafter referred to also as "Non-patent literature 2"), for example.

In the meantime, Japanese Patent Kokai Publication No. 2001-219294 (which is hereinafter referred to also as "Patent literature 4") discloses a solder paste which is formed by kneading solder powder and a resin having a flux. Moreover, there is a proposed process for mounting a semiconductor chip over a substrate by using a resin comprising a low-melting-point metal filler. See Japanese Patent Kokai Publication No. 2004-260131 (which is hereinafter referred to also as "Patent literature 5"), "10th Symposium on "Microjoining and Assembly Technology in Electronics" Feb. 5-6, 2004, pp. 183-188 (which is hereinafter referred to also as "Non-patent literature 3") and "9th Symposium on "Microjoining and Assembly Technology in Electronics" Feb. 6-7, 2003, pp. 115-120 (which is hereinafter referred to also as "Non-patent literature 4"). In this proposed process, self-aligned formation of metal connection is performed between the substrate and the semiconductor chip by melting the metal filler (i.e., electrically conductive particles) contained in the resin. However, there is nothing else that primarily studies the mechanism of the self-aligned formation of the metal connection is, especially in Non-patent literature 3 and Non-patent literature 4.

It is also disclosed to use a reducing resin in Non-Patent literature 3, Non-Patent literature 4 and Patent literature 5 cited above. This reducing resin is a so-called "no-flow type underfill material" (see Japanese Patent Kokai Publication No. 2001-329048 for example). When acid anhydride serving as a curing agent is added to the reducing resin, the acid anhydride is hydrolyzed to produce carboxylic acid, and thereby a flux property is obtained.

SUMMARY OF THE INVENTION

The processes disclosed in Patent literature 1 and Patent literature 2 are designed for selectively precoating electrodes formed on a substrate with solder, and thus they have such problems as described below when applied to the bump formation process needed in flip chip mounting.

Both of the processes disclosed in Patent literature 1 and Patent literature 2 involve local variations in thickness and concentration of the solder, causing the deposition amount of the solder to differ from one electrode to another, and therefore they cannot form bumps which are all equal in height. Also as to such processes, the paste composition is applied onto the substrate of which the surface is not smooth due to the electrodes formed thereon. As a result, a lesser amount of solder is supplied on the electrodes, which are higher than the surface of the substrate, and thus it is difficult to form the bumps having sufficient height required for the flip chip mounting.

The process disclosed in Patent literature 1 is specifically designed for preventing a shirt circuit between the adjacent electrodes as well as for providing solder powder with wettability to metal by controlling surface oxidation of the solder powder. However, it is difficult to form the bumps having predetermined height while satisfying the conflicting requirements of "providing of wettability" and "prevention of short-circuit" by controlling an extent and a process of the oxidation.

Moreover, in the case of the deposition type solder material disclosed in Patent literature 2, the material takes advantage of a particular chemical reaction, and thus there is low flexibility in a selection of solder composition, making it difficult to use Pb-free solder.

The process disclosed in Patent literature 3, in contrast, can form uniform bumps since the solder powder deposits uniformly on the electrodes, and has high flexibility in a selection of solder composition, making it easier to use Pb-free solder. However, height of the bump is determined by the particle size of the solder powder to be deposited wherein the increase of the particle size of the solder powder makes it difficult to allow the solder powder to deposit uniformly on the electrodes. As a result, height uniformity of the bumps becomes impaired when it is attempted to achieve a required height of the bumps during the flip chip mounting process.

In a step of selectively forming the adhesive film on the electrode surfaces, the step being indispensable for the process of Patent literature 3, it is necessary to carry out a special treatment using a chemical reaction. Thus, such step is complicated and makes it to increase the manufacturing cost, which will leads to unsuitability for mass production.

The formation of the solder bumps by the process disclosed in Patent literature 4 involves difficulty in achieving the fine pitch since it employs a printing process using a conventional metal mask.

As to the processes disclosed in Patent literature 5, Non-Patent literature 3 and Non-Patent literature 4, there may be residual solder powder due to less mobility of the solder powder located between the electrodes.

Under these circumstances, the present invention has been created. Therefore, an object of the present invention is to provide a high-productivity process for forming a large number of bumps more uniformly, which can be applicable to the flip chip mounting of the next-generation LSI.

The present invention provides a process for forming bumps, comprising the steps of:

(1) preparing a substrate on which a plurality of electrodes are formed;

(2) supplying a resin comprising solder powder and a convection additive onto the substrate; and (3) heating the substrate to a temperature that enables the solder powder to melt. In the heating step, the molten solder powder is allowed to self-assemble onto the electrodes, and thereby the bumps are formed on the electrodes. The resin to be supplied onto the substrate is a resin composition that comprises the solder powder and the convection additive. It is preferred that a thin film is formed on the substrate by applying such resin composition to the substrate.

According to the process of the present invention, the solder powder can move easily within the resin composition when the wiring substrate is heated to such an extent that the solder powder melts. As a result, the solder powder can self-assemble easily onto the electrodes. From this viewpoint, it is preferred that the substrate is heated up to a temperature that enables viscosity of the resin to decrease.

In one embodiment of the present invention, it is preferred that the heating step of the substrate is carried out at a temperature that is above a boiling point of the convection additive. In another embodiment of the present invention, it is preferred that the boiling convection additive convects within the resin. In further another embodiment of the present invention, it is preferred that the solder powder convects within the resin in the heating step. These embodiments may be performed independently, or may be combined with each other, or may be performed all together.

When the convection additive which has boiled by the heating convects in the resin and/or the solder powder convects in the resin, mobility of the solder powder is enhanced so that the molten solder powder can aggregate or agglomerate uniformly. As a result, a uniformly grown solder powder is allowed to self-assemble onto the electrodes, making it possible to simultaneously form a plurality of the fine bumps having higher uniformity. It is not desirable that there is no melted solder powder when the convection additive has boiled. It is therefore preferred that a boiling point of the convection additive is below a melting point of the solder powder. However, the convection additive may boil at the same time when the solder powder begins to melt, or it may boil immediately after the melting of the solder powder is completed. Even in this case the convective effect of the convection additive is provided. That is to say, regardless of which of the boiling of the convection additive or the melting of the solder powder occurs first, the effect of the present invention is provided as long as both conditions are satisfied.

In a preferred embodiment of the present invention, the convection additive is at least one material selected from the group consisting of solvent, glycerin, wax (e.g., electron wax or the like), isopropyl alcohol, butyl acetate, butyl carbitol and ethylene glycol. The term "solvent" as used throughout this description and claims means a liquid component (component which remains in liquid phase at room temperature) that constitutes "flux". This "flux" is a so-called flux that is conventionally used for a soldering. Example of the solvent may include an alcohol (e.g., buthylcarbitolacetate and the like) and an organic solvent (e.g., isopropyl alcohol and the like). The effect of the convection additive can be provided even in a case where the above solvent is contained in the flux. In a case where the flux comprising a reducing material and the solvent is used, gas bubble of oxygen may be additionally generated through a reaction of reducing an oxide of the metal (e.g., electrically conductive wiring pattern and electrically conductive particle). In this case, such gas bubble can assist the effect of the convection additive and thus is desirable. Water contained in the substrate also can serve as the convection additive. In a case where the flux is used, the resin used in the present invention may comprise resin, active agent, delustering agent and/or the like, all of which are usually contained in the flux. In other words, the resin used in the present invention may not only the solvent but also some components other than the solvent that is contained in the flux. Namely, the resin may comprise the flux.

In another embodiment of the present invention, the convection additive may be material that can release or generate a component capable of boiling in the heating step. That is to say, the convection additive may be a compound that can newly provide a component capable of boiling under a thermal environment in the heating step. Specifically, such compound may be one which decomposes when heated, so as to generate a component having a similar function to that of the convection additive. Example of such compound may include a hydrate, in particular a crystal water-containing compound such as aluminum hydroxide, dawsonite, ammonium metaborate, barium metaborate, azodicarbonamid or sodium hydrogen carbonate.

In a preferred embodiment, the resin that is to be supplied onto the substrate, namely, the resin composition used for forming the bumps comprises any one of thermosetting resin (e.g., epoxy resin), thermoplastic resin (e.g., polycarbonate resin) and photo-setting resin (e.g., UV-curable resin such as light-curable epoxy resin). However, the resin may additionally comprise another resin (e.g., phenol resin) as long as the effect of the present invention is not adversely affected. As will be readily appreciated from this description, in a case of the thermosetting resin, a curing process must not be completed in the heating step, and preferably no curing process is substantially initiated in the heating step. Even in a case where the curing process of the resin is initiated in the heating step, it is preferred that progression of the curing process is substantially curbed. On the other hand, after the formation of the bumps, the progression and the completion of the curing process may be performed by further heating the substrate.

In a preferred embodiment of the present invention, the substrate is heated while keeping the flat plate in contact with the surface of the supplied resin in the heating step. In this case, it is preferable to hold the flat plate at a constant distance from the electrodes of the substrate (namely from the substrate) in order to form a constant gap. In other words, it is preferable to prevent a gap width formed between the electrodes of the substrate and the flat plate from varying in the heating step.

In a preferred embodiment of the present invention, in the heating step, the substrate is heated while pressing the supplied resin by applying a constant pressure to the flat plate. In order to prevent a gap width formed between the electrodes and the flat plate from varying as described above, the pressure may be applied to the supplied resin during at least a part of the heating step. The flat plate is preferably made of material that has low wettability to the solder powder material (for example, made of glass). Alternatively, the flat plate has a layer of such material on its surface in which case such layer is supposed to be in contact with the supplied resin.

The solder powder preferably has a sharp distribution of the particle size. More preferably, the solder powder consists of particles having approximately the same size. In a preferred embodiment of the present invention, in the heating step of the substrate, a constant gap width formed between the electrodes and the flat plate is larger than, and preferably much lager than the particle size of the solder powder. For example, a maximum size of the solder powder is preferably less than 100% of the gap with, and more preferably less than 90% of the gap with.

In a preferred embodiment of the present invention, the convection additive boils and migrates as vapor to the outside through a periphery of the gap formed between the substrate and the flat plate in the heating step of the substrate.

In a preferred embodiment, a metal pattern is formed on a surface of the flat plate, the surface being opposed to the substrate. In this case, the metal pattern has substantially the same configuration as that of the plurality of electrodes of the substrate. The flat plate may be a LSI chip, and the substrate may be also a LSI chip.

In a preferred embodiment, in case where the flat plate is used in the step of heating the substrate, the flat plate is moved away from the resin surface after the bumps have been formed on the electrodes. In this case, it is preferable to form the bumps which have height larger than the distance that has been formed between the electrodes and the flat plate until the moving of the flat plate. After the formation of the bumps, the substrate is cooled down.

In a preferred embodiment, the step of heating the substrate is followed by a step of cooling the substrate, in which case, after the substrate is cooled down, the flat plate which has been in contact with the resin surface is moved away from the resin surface.

In a preferred embodiment, the step of heating the substrate is followed by a step of cooling the substrate, in which case the substrate is cooled followed by a step of removing the resin. According to the process of the present invention, the bumps are generally surrounded by the supplied resin and thus such resin can be removed for example by ultrasonic cleaning process using an organic solvent.

In a preferred embodiment, the resin is supplied so as to cover at least the plurality of electrodes formed on the substrate in the supplying step. As a result, in the heating step, the molten solder powder is allowed to self-assemble onto the electrodes so that the bumps is formed substantially only on the electrodes. The resin may be supplied by any suitable method, for example by applying with a dispenser.

In a preferred embodiment, a metal film having high wettability to the solder powder is formed on the surfaces of the plurality of electrodes of the substrate. The metal film is preferably made of metal such as Cu or Au or an alloy that comprises such metal. The metal film may be formed for example by sputtering.

A film having low wettability to the solder powder may be formed on a surface of the substrate where the plurality of electrodes are not formed. For example, a film of solder mask (solder resist) can be formed.

The solder powder may be made of any suitable solder material. In a preferred embodiment, the solder powder is made of a so-called Pb-free solder material.

In a preferred embodiment, the content of the solder powder contained in the resin (i.e., the resin composition to be supplied onto the substrate) ranges from 0.5 to 30% by volume, preferably from 0.5 to 20% by volume. In one embodiment, the content of the convection additive contained in the resin (i.e., the resin composition to be supplied onto the resin) ranges from 0.1 to 20% by volume, more preferably from 1 to 10% by volume. The percentage by volume is given as the value at a room temperature (25° C.) As required, the resin may additionally comprise a component that is contained in the flux as described above, for example.

The present invention also provides a resin (i.e., a resin composition comprising solder powder and a convection additive) used in the processes for forming bumps according to the various embodiments as described. Such resin composition is suitably used for forming bumps on electrodes of the substrate or a semiconductor chip when the semiconductor chip is flip-chip mounted over the substrate.

In the process for forming bumps of the present invention, the molten solder powder can move within the resin in the heating step. In a preferred embodiment, the heating step allows the convection additive (which is contained in the resin) to boil and convect within the resin, and thereby the mobility of the solder powder is enhanced. This results in a uniform aggregation or agglomeration of the molten solder powder in the resin. The uniformly agglomerated solder powder is allowed to grow on the electrodes having high wettability. As a result, a high uniformity of the bumps formed on large number of electrodes is achieved.

Furthermore, keeping the flat plate in contact with the surface of the supplied resin serves to prevent the boiling convection additive from escaping in the form of vapor to the outside through the exposed surface (i.e., upper surface) of the supplied resin. This can keep an effective convection or movement of the additive in the resin, which will lead to a high uniformity of the resulting bumps.

Furthermore, according to the process for forming bumps of the present invention, the solder powder (which is dispersed in the resin) is provided with kinetic energy of convective motion of the boiling convection additives, and thereby the solder powder can effectively self-assemble onto the electrodes. As a result, it is possible to reduce the amount of solder powder contained in the resin.

Figure 1:
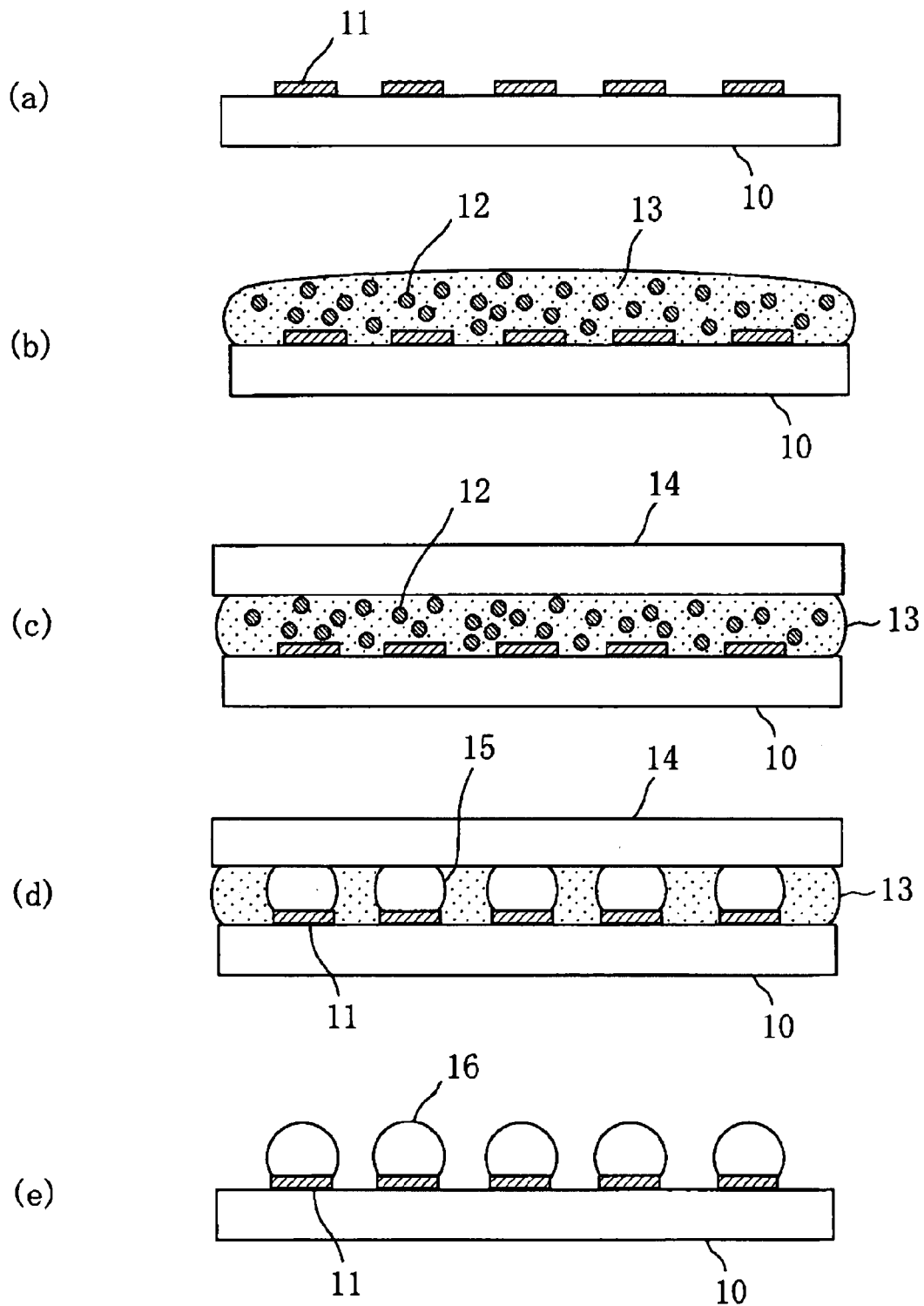
FIGS. 1(a) to 1(e) show cross-sectional views illustrating the steps in a process for forming bumps according to an embodiment of the present invention.

In the drawings, the reference numbers correspond to the following elements:
10: Substrate (board)
11, 21: Electrode
12: Convection additive
13: Resin
14: Flat plate
15, 32, 72: Solder ball
16: Bump
20, 70: Semiconductor chip
21: Electrode
22: Underfill material
30: Metal pattern
31: Vapor
35: Convective flow
40: Solder ball
50: Central region of substrate where no electrode is formed
60: Metal film
61: Film
71: Electrode terminal
73: Ultraviolet ray (UV)

DETAILED DESCRIPTION OF THE INVENTION

The present inventors focused on the high performance in mass production demonstrated by solder leveler process which has a proven record as the technology to precoat a printed circuit board with solder, and conducted research into the causes of variations in the bump height and the inability to form the bumps of a desired height when the solder leveler process is applied to the formation of bumps, and reached the presumption described below. The presumption is the inventors' belief which does not pose any restriction on the present invention.

Consider a step of selectively forming bumps from molten solder powder on electrodes, in the process of forming the bumps using a solder paste of solder powder and a flux. When the solder paste applied onto the substrate is heated, the solder powder melts and wafts in the flux. When the molten solder powder meets another piece of molten solder powder nearby, they join with each other to grow into a solder ball. As the solder ball which has grown sediments and deposits onto the electrode, the solder spreads over the electrode surface due to the wettability, and thereby the solder bump is formed on the electrode surface.

Since the bump forming process completes in a very short period of time (several seconds to ten-odd seconds), it is supposed that the bump forming process proceeds in a very small localized region. The solder paste is a mixture of the solder powder and the flux, and the space in which the molten solder powder can move is very small when the molten solder powder wafts in the flux. Thus it is supposed that most of the solder balls depositing on the electrodes have been formed through aggregation or agglomeration of the molten solder powder located adjacent to the electrode.

The particle sizes of the solder powder may not necessarily be distributed evenly in the solder paste, and thickness of the oxide film which is inevitably formed on the surface of the solder powder may not necessarily be uniform. As a result, sizes of the solder balls formed in a local region tend to be varied. In addition, the solder paste applied onto the substrate is subject to variations in the thickness and in the concentration of the solder powder, which may lead to increase of the variation in the sizes of the solder balls that form the bumps.

While the height of the solder bumps may be increased by increasing the thickness of the solder paste being applied, aggregation or agglomeration of the molten solder powder in the solder paste is considered to constitute one of the causes of the variation in the solder bump size as described above. Therefore, variation in the height of the bumps remains unsolved even when the desired height thereof is obtained.

Accordingly, the present inventors conducted research into the method of allowing the bump forming process to proceed in a region larger than that of the case of the localized bump forming process described above, and reached the concept of the present invention.

First, the inventor considered that a sufficient space in which the molten solder powder can move could be ensured by containing the solder powder in a resin. Use of a resin, which lowers the viscosity or preferably turns into liquid at the melting temperature of the solder powder, makes it easier for the molten solder powder to move and waft in the resin.

However, since the bump forming process completes in a very short period of time, as described above, it would not be enough to ensure the space where the molten solder powder can move. In a case where the molten solder powder self-assembles onto the electrodes simply due to the wettability, it is supposed that there occurs variability in that the solder powder, which has locally aggregated or agglomerated, self-assembles onto the electrodes, thus making it impossible to obtain uniform bumps. Based on this supposition, it was concluded that, by applying a means for forcibly moving the molten solder powder, the bump forming process would be allowed to proceed more stably in a wider region.

Such conclusion led to an idea of providing the resin which not only contained the solder powder, but also contained a component as an additive capable of boiling at the melting temperature of the solder powder. That is to say, it was considered that the boiling additive would convect in the resin, assisting the movement of the solder powder in the resin, and thereby the aggregation or agglomeration of the molten solder powder would proceed in a wider region of the resin. The additive described above may be one that boils at the melting temperature of the solder powder or at a lower temperature (preferably at a slightly lower temperature), or one that boils at a temperature higher than the melting temperature of the solder powder (preferably at a slightly higher temperature), while the former is more preferable.

Accordingly, the present inventors conducted an experimental test for comparing a resin containing solder powder only and another resin containing not only solder powder but also an additive (e.g., material capable of boiling at or below a temperature that enables the solder powder to melt). The resin containing the solder powder only and the another resin containing the solder powder and the additive were respectively applied onto a printed board whereon round electrodes were arranged in the form of "array". Subsequently, the heating treatment was carried out while keeping a flat plat in contact with the supplied resins.

Figure 16:
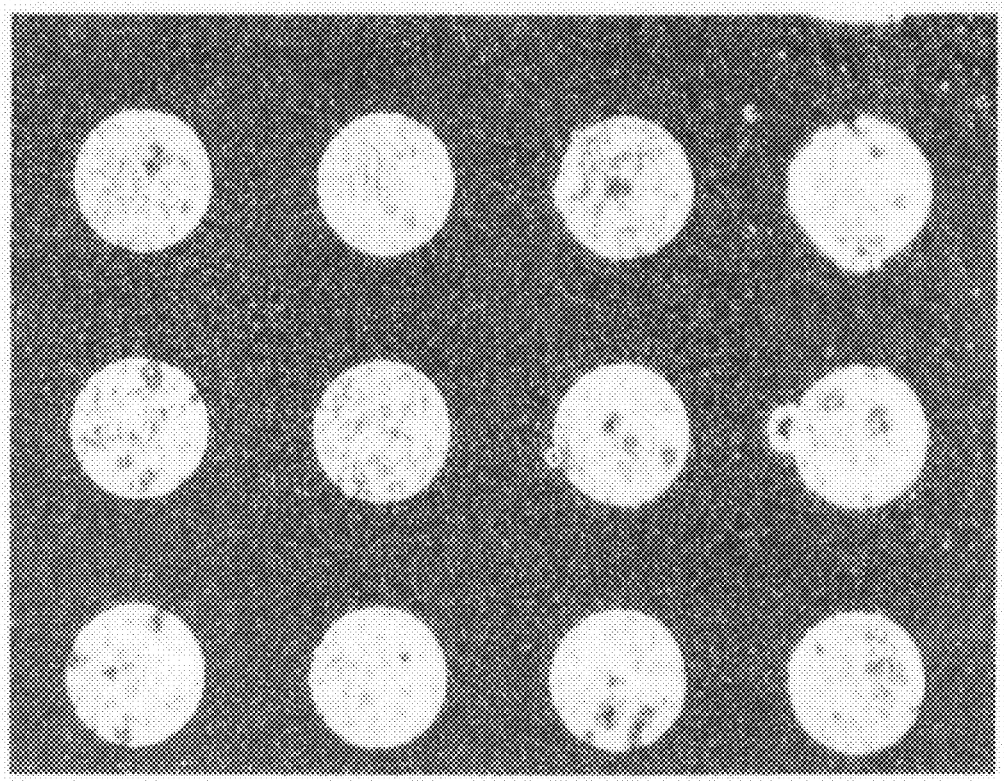
FIG. 16 is a photograph showing the state of a resin containing solder powder in which case the resin has been applied onto round electrodes and then heated.
Figure 17:
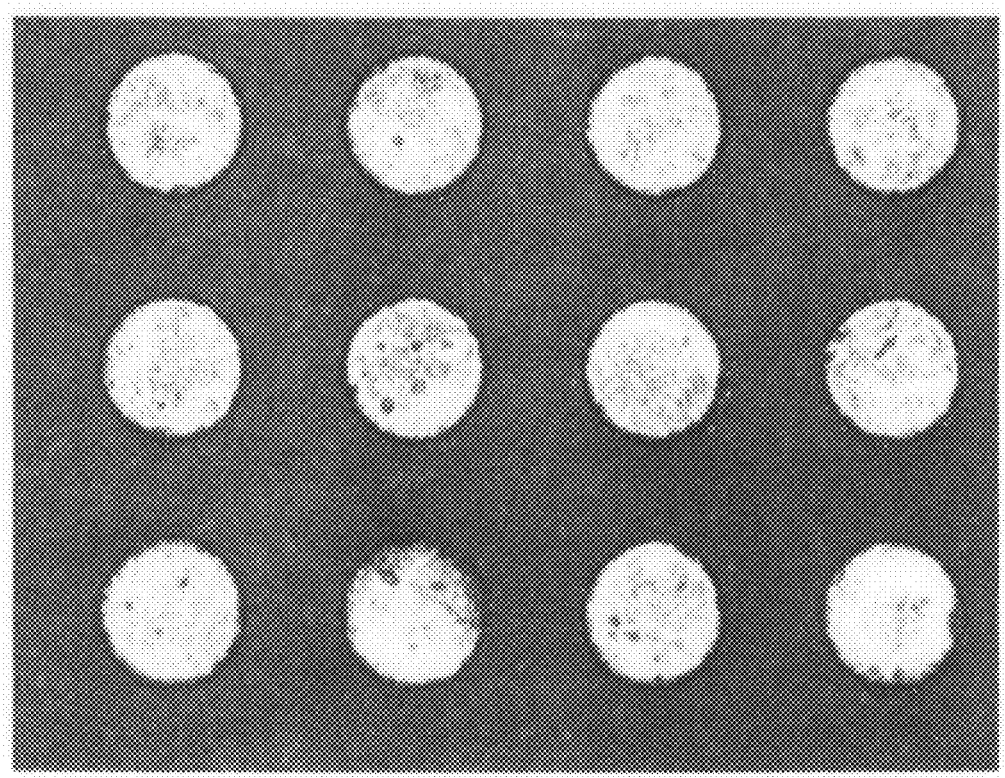
FIG. 17 is a photograph showing the state of a resin containing solder powder and a convection additive in which case the resin has been applied onto round electrodes and then heated.

It was confirmed that there is a difference between the resin containing no additive and the another resin containing the additive as follows:

In the case of the resin containing the solder powder only, a solder layer was not satisfactorily formed, and some solder powder remained dispersed in the region between the round electrodes (see FIG. 16); and whereas In the case of the resin containing the solder powder and the additive, solder bumps were satisfactorily formed on all the round electrodes, and no solder powder remained dispersed in the region between the round electrodes (see FIG. 17).

The experimental test described above was conducted by using the following materials and conditions:

The resin containing the solder powder only (i.e., the case shown in FIG. 16)
  Resin: epoxy resin
  Solder powder: SnAgCu (melting point 220° C.)
  The proportions of resin and solder powder (resin:solder powder): 50% by weight:50% by weight
  Printed board: ALIVH manufactured by Panasonic Electronic Devices Co., Ltd. (Diameter of electrode: 300 µm, pitch: 500 µm)
  Heating temperature of the board: 250° C.

The resin containing the solder powder and the convection additive (i.e., the case shown in FIG. 17)
  Resin: epoxy resin
  Solder powder: SnAgCu (melting point 220° C.)
  Convection additive: added as flux (boiling point 170° C.)
  The proportions of resin, solder powder and flux (resin: solder powder:flux): 45% by weight:50% by weight:5% by weight
  Printed board: ALIVH manufactured by Panasonic Electronic Devices Co., Ltd. (Diameter of electrode: 300 µm, pitch: 500 µm)
  Heating temperature of the board: 250° C.

In the case of FIG. 17, it was confirmed that the additive contained in the resin ("additive" is hereinafter referred to also as "convection additive") had boiled under such a temperature condition that the solder powder melted, and that the bumps were gradually formed well on the round electrodes as the boiling convection additive was convecting within the resin. Therefore, it is suggested that "convection" of the convection additive serves to promote the movement of the molten solder powder, which leads to achievement of a uniform aggregation or agglomeration of the molten solder powder. By contrast, in the case of FIG. 16, such uniform aggregation or agglomeration of the molten solder powder could not have been achieved due to the absence of the convection additive.

With reference to the attached figures, embodiments of the present invention will be hereinafter described in more detail. As to the drawings, the constituent elements having a substantially similar function carry the same reference number for ease of the explanation. It will be noted that the present invention will not necessarily be limited to the following embodiments.

First Embodiment

FIGS. 1(a) to 1(e) show views illustrating basic steps in the bump forming process of the present invention according to the first embodiment.

First, a substrate 10 having a plurality of electrodes 11 formed thereon is prepared (FIG. 1(a)). Then as shown in FIG. 1(b), a resin 13 which comprises solder powder (not shown) and a convection additive 12 is supplied onto the substrate 10. The resin may be prepared by mixing these components in any suitable way and may be supplied in any suitable way. For example, a thin layer of such resin may be formed on the substrate 10. Then, the substrate 10 is heated up to a temperature that enables the solder powder to melt while keeping a flat plate 14 in contact with the surface of the resin 13 supplied onto the substrate 10, as shown in FIG. 1(c). In another embodiment, the substrate in the state shown in FIG. 1(c) may be put into a heating environment (for example, an oven).

In this heating step, the molten solder powder is allowed to self-assemble, and all solder balls 15 which have grown through the self-assembly are concurrently formed on the plurality of electrodes 11 in a self-alignment manner (FIG. 1(d)). Then, as shown in FIG. 1(e), the flat plate 14 is moved away from the surface of the supplied resin 13 followed by removing the resin 13 so as to obtain the substrate 10 whereon the bumps 16 are formed on the plurality of electrodes. In FIG. 1(e), the resin is removed from around the bumps 16 by cleaning with a solvent.

Figure 2:
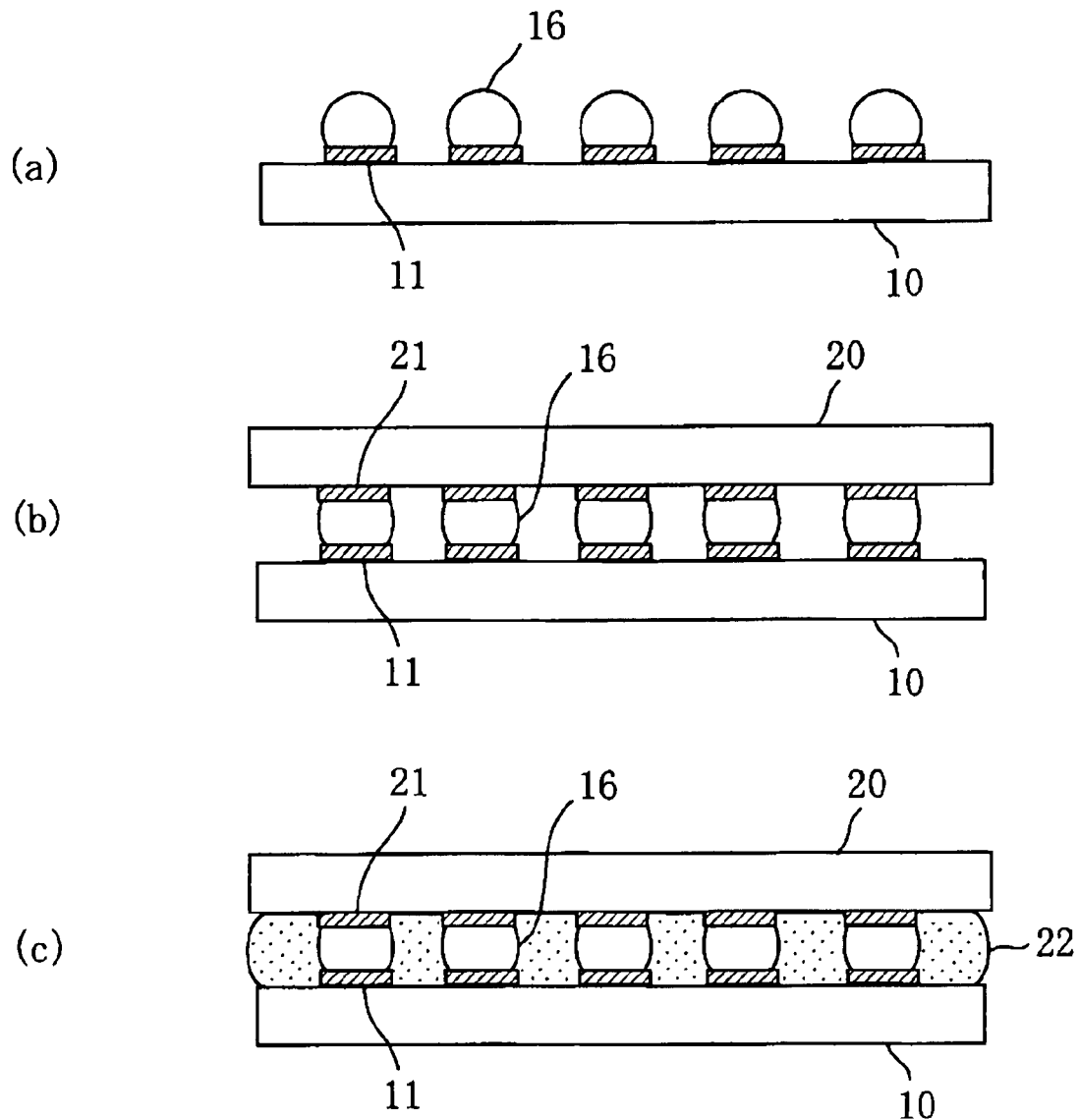
FIGS. 2(a) to 2(c) show cross-sectional views illustrating the steps in a flip chip mounting process of the present invention.

FIGS. 2(a) to 2(c) show views illustrating the steps of the flip chip mounting process wherein the substrate 10 having the bumps 16 thereon is used, and the semiconductor chip 20 is mounted over the substrate 10.

After preparing the substrate 10 whereon the bumps 16 are formed through the steps of FIGS. 1(a) to 1(e) (FIG. 2(a)), the semiconductor chip 20 is mounted over the substrate 10 so that the electrodes 11 of the substrate 10 and the electrodes 21 of the semiconductor chip 20 come into contact with each other via the bumps 16 as shown in FIG. 2(b). Then, the substrate is heated so as to melt the bumps 16 and establish connection between the electrodes. After pouring an underfill material 22 between the substrate and the semiconductor chip as shown in FIG. 2(c), the substrate 10 is heated to thermally cure the underfill material 22, and thereby the flip chip mounting process is completed.

Figure 3:
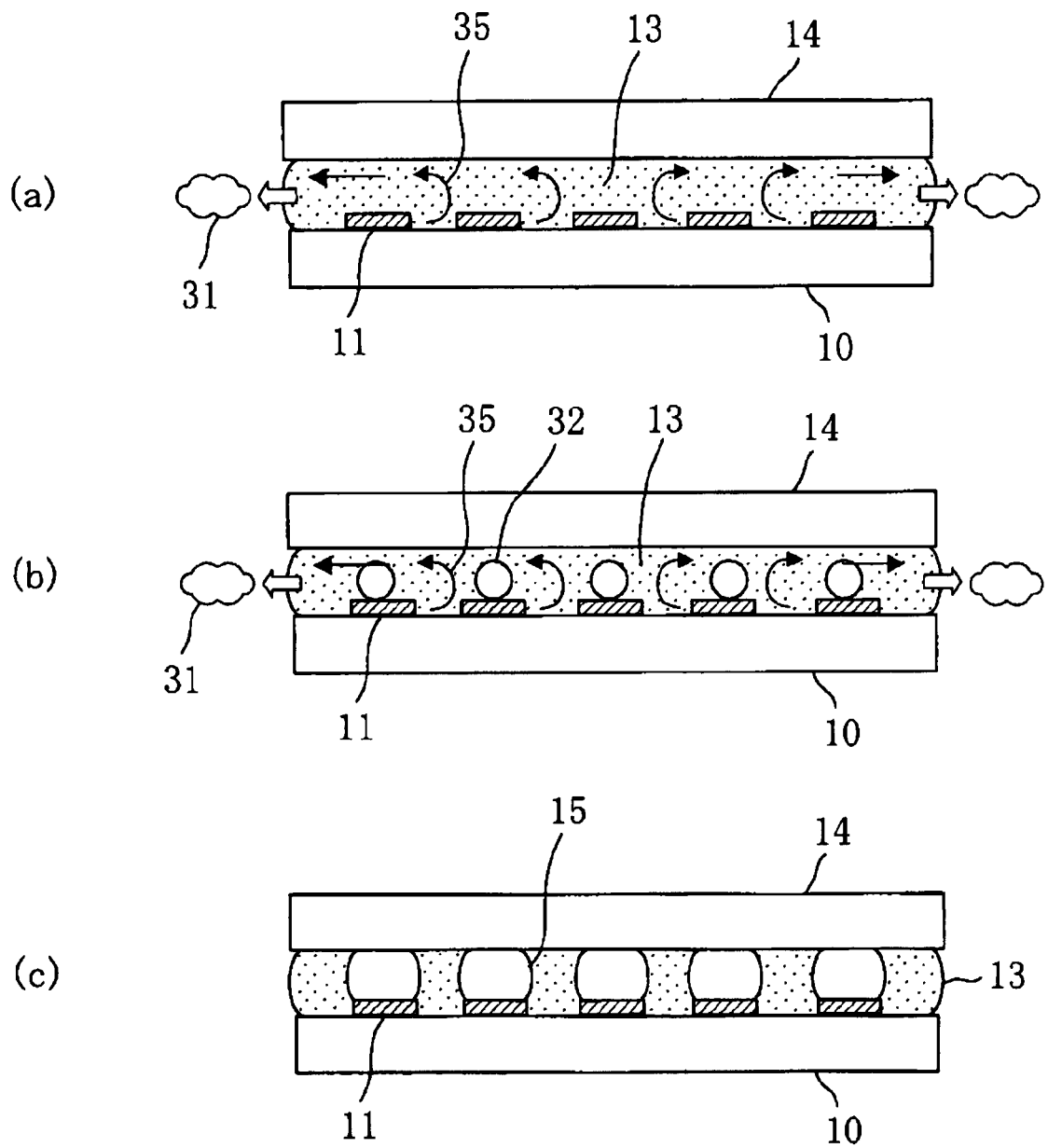
FIGS. 3(a) to 3(c) show cross-sectional views illustrating the bump forming mechanism according to the present invention.

With reference to FIGS. 3(a) to 3(c), the mechanism whereby uniform bumps are satisfactorily formed according to the present invention will now be described.

FIG. 3(a) shows the state of the substrate 10 being heated to the melting temperature of the solder powder, after supplying the resin 13 comprising the solder powder and the convection additive onto the substrate 10 followed by bringing the flat plate 14 into contact with the surface of the supplied resin 13. In FIG. 3(a), the solder powder and the convection additive contained in the resin are omitted.

With the substrate heating temperature being set higher than the boiling temperature of the convection additive, heating of the substrate not only causes the solder powder to melt but also causes the convection additive to boil. As a result, the boiling convection additive convects as a gas within the resin 13 as indicated by the arrows in FIG. 3(a). Convection of the boiling convection additive promotes the movement of the molten solder powder in the resin so that the aggregation or agglomeration of the solder powder proceeds uniformly.

As shown in FIG. 3(b), the molten solder powder that has aggregated or agglomerated grows into solder balls 32 of uniform size. Since the electrodes 11 has high wettability and the portion of the substrate 10, which has no electrode, has low wettability to the molten solder powder, the solder balls 32 grow and self-assemble selectively on the electrodes 11. As the self-assembly proceeds, the solder balls 32 formed on the electrodes 11 grow to such a size that it touches the flat plate 14 as shown in FIG. 3(c), and thereby the solder balls (bumps) 15 having uniform size are formed on the electrode 11.

The arrows shown in FIG. 3(a) and FIG. 3(b) are intended to schematically show the directions of the convective movement of the convection additive, and do not indicate the actual direction of the convective movement of the convection additive. As shown in FIG. 3(a) and FIG. 3(b), the boiling convection additive was observed to move throughout the gap region between the substrate 10 and the flat plate 14 by convection and then migrates through the periphery of the gap region to the outside atmosphere as vapor 31. Thus it is supposed that the convective movement of the convection additive occurs in a wider region, and that the molten solder powder is urged to move over a certain distance due to the convective movement of the convection additive.

As will be readily appreciated from the above description about the convection additive, the terms "convection", "convect" and "convecting" used regarding the convection additive throughout this description and claims mean not only convection as used in a strict sense, but also various movements of the additive. That is to say, the terms "convection", "convect" and "convecting" are used for descriptive purpose since these terms include "convection" used in a strict sense as one embodiment of the additive movements. Therefore, as long as a movement of the boiling additive contained in the resin 13 gives energy for the solder powder (which is dispersing in the resin 13) to enhance the mobility of the solder powder, such movement shall be included in "convection", "convect" or "convecting" used in this description and claims, regardless of what kind of embodiment such movement has.

Similarly, in a case of the terms "convection", "convect" and "convecting" used regarding the solder powder, these terms mean not only convection as used in a strict sense, but also various movements of the solder powder. That is to say, even in this case, the terms "convection", "convect" and "convecting" are used for descriptive purpose since these terms include "convection" used in a strict sense as one embodiment of the movements of the solder powder.

The solder powder may not necessarily be dispersed evenly throughout the resin. Therefore, the aggregation or agglomeration may occur only in the adjacent particles of the solder powder, unless the movement of the solder powder is promoted as that in the present invention, thus leading to variation in the size of the grown solder balls. Such variation makes it difficult to form the bumps having uniform height on a large number of electrodes of the substrate, which will lead to impracticality of the mass production.

According to the present invention, since the movement of the molten solder powder is promoted sufficiently by the convective movement of the boiling convection additive, the localized aggregation of the solder powder is suppressed so that the aggregation or agglomeration of the solder powder proceeds over wider region in the resin. As a result, the bumps having uniform height can be formed on all the electrodes of the substrate.

The convection additive serves to force the solder powder (which is dispersing in the resin) to move. Therefore, the solder powder can self-assemble more effectively onto the electrodes than a case where the solder powder self-assembles only by means of "wettability". It is therefore possible to form the required amount of bumps on the electrodes with a proper quantity of solder powder, without containing an excessive solder powder in the resin.

Turning now to FIGS. 1(a) to 1(e) again, embodiment of the present invention will be described in more detail. As shown in FIG. 1(a), the substrate 10 having the electrodes 11 formed on the surface thereof is prepared. While the substrate 10 may be a resin substrate used as a circuit board or a semiconductor chip, it may also be another substrate as long as electrodes are formed thereon. While there is no limitation on the pitch of arranging the electrodes 11, the pitch is preferably 500 μm or less and more preferably 250 μm or less according to the present invention. The electrodes 11 are formed of Cu, Au or the like.

Next, after carefully cleaning the surface of the substrate 10 whereon the electrodes 11 are formed with a solvent or the like, the resin 13 comprising the solder powder (not shown) and the convection additive 12 is applied onto the surface of the substrate 10 as shown in FIG. 1(b). As the solder powder, Sn—Ag solder powder (e.g., Sn—Ag solder powder with Cu and the like) can be used for example. However, the solder powder used in the present invention is not limited to this Sn—Ag solder powder. For example, the following solder powder can be used:

Pb-free solder powder or Pb—Sn solder powder which is melted to form Sn—Zn alloy or Sn—Bi alloy; or Low-melting-point solder powder which is melted to form Cu—Ag alloy.

It is preferred that the melting point of the solder powder ranges from 100 to 300° C., and more preferably from 130 to 280° C.

As the convection additive 12, a material capable of boiling at or below a temperature that enables the solder powder to melt (e.g., a temperature of from 100 to 300° C. or a lower temperature) is preferably used. For example, various solvents used in a resin based-flux that contains an organic acid as an active component can be used as the convection additive. In addition, wax (particularly electron wax or the like), glycerin, isopropyl alcohol, butyl acetate, butyl carbitol, ethylene glycol or the like can be also used as the convection additive. The convection additive can boil slightly below the melting point of the solder powder, and preferably it boils at a temperature lower than the melting point of the solder powder by from 10 to 100° C., and more preferably by from 10 to 60° C. Alternatively, the boiling point of the convection additive may be substantially the same as the melting point of the solder powder. Alternatively, the convection additive may boils slightly above the melting point of the solder powder, and preferably it may boil at a temperature higher than the melting point of the solder powder by from 10 to 100° C., and more preferably by from 10 to 20° C.

In a case where the boiling point of the convection additive is lower than the melting point of the solder powder, the solder powder melts after the convection additive boils, and thereafter the boiling convection additive promotes the movement of the molten solder powder. By contrast, in a case where the boiling point of the convection additive is higher than the melting point of the solder powder, the convection additive boils after the solder powder melts, and thereafter the boiling convection additive promotes the movement of the molten solder powder. In both cases, the temperature is increased so as to melt the solder powder in the heating step.

For example, epoxy resin can be used as the resin. In addition, thermosetting resin, thermoplastic resin, photo-setting resin (e.g., UV-curable resin) or the like can be also used as the resin. It is preferred that the resin is capable of decreasing its viscosity at the heating temperature so as to facilitate the movement of the solder powder in a molten or solid state during the heating step. In the case of the thermosetting resin, a curing process may be initiated in the heating step, but it must not proceed to such an extent that it impedes the effect of the convection additive described above. It is preferred that the curing process does not substantially proceed in the heating step.

Subsequent to the application of the resin 13 onto the surface of the substrate 10, the substrate 10 is heated to the melting temperature of the solder powder (for example, a temperature higher than about 220° C. in the case of Sn—Ag solder powder) while keeping the flat plate 14 in contact with the surface of the supplied resin 13, as shown in FIG. 1(c). At this time, since the viscosity of the resin normally decreases to one-half of that at the normal temperature or lower, the molten solder powder wafts in the resin.

In the heating step, the convection additive 12 is allowed to boil and move (convect) within the resin. "Convection" of the convection additive 12 promotes the movement of the molten solder powder, which leads to a uniform aggregation or agglomeration of the molten solder powder. As a result, the solder balls 15 which have grown uniformly are formed in self-alignment manner on the electrodes 11, as shown in FIG. 1(d).

Keeping the flat plate 14 in contact with the surface of the supplied resin serves to prevent the boiling convection additive 12 from escaping as vapor to the outside through the upper surface of the supplied resin. This makes it possible for the boiling convection additive to move in the resin composition in parallel to the substrate and then migrate through the periphery of the substrate to the outside. As a result, the molten solder powder is urged to move over a wider region.

The flat plate 14 is preferably made of a material having low wettability to the solder powder, such as glass plate. Low wettability makes the selectivity of the growth of the solder balls on the electrodes 11 of the substrate 10 relatively higher. Similar effect can be achieved by forming a film of a material having low wettability to the solder powder (for example, a film of solder mask (solder resist)) on the surface of the flat plate 14.

In order to allow the molten solder powder to aggregate or agglomerate and grow into solder balls 15 having uniform size, it is preferable that the particles of the solder powder dispersed in the resin have substantially the same size. Also in order to allow the boiling convection additive 12 to move freely over somewhat wider region within the resin, or allow the molten solder powder to move freely over somewhat wider region within the resin, the distance between the electrodes 11 and the flat plate 14 is preferably maintained constant during the heating step. Such constant distance is preferably larger than the particle size of the solder powder. In order to prevent the solder balls 15 formed on the electrodes 11 from deforming in the heating step, the flat plate 14 is preferably hold in place so as not to be displaced.

In another embodiment, no deformation of the solder balls 15 that have grown uniformly can be achieved by heating the substrate 10 while pressing the resin 13 for example by applying a constant pressure to the flat plate 14.

Finally, by moving the flat plate 14 away from the surface of the supplied resin 13 followed by removing such resin 13, the substrate 10 having the bumps 16 of uniform size formed on the plurality of electrodes 11 is obtained, as shown in FIG. 1(e). In this regard, the resin 13 may be left to remain on the wiring substrate 10 after the removal of the flat plate 14. However, there may be a minute scale of the residual solder powder left within the resin 13, it is therefore preferred in terms of a connecting reliability that such residual solder powder is removed by removing the resin 13.

Since the boiling convection additive has the effect of forcibly moving the solder powder that is dispersed in the resin 13, as described previously, it is made possible to cause the solder powder to self-assemble more efficiently onto the electrodes 11 than the case of the self-assembly of the solder powder which simply makes use of wettability only. As a result, it is made possible to form the required amount of bumps 16 on the electrodes 11 from a proper quantity of the solder powder, without containing an excessive solder powder in the resin 13. The optimum content of the solder powder can be determined as follows.

From an assumption that all the solder powder contained in a volume $V_B$ of the resin composition 13 (containing the solder powder and the convection additive) supplied onto the substrate 10 contributes to the formation of the bumps 16 on the electrodes 11 of the substrate 10, the following relational formula (1) is supposed to hold for a total volume $V_A$ of the bumps 16 and the total volume $V_B$ of the resin composition 13:

$$V_A : V_E \approx S_A : S_B \quad (1)$$

In the relational formula (1), $S_A$ is a total area of the electrodes 11 of the substrate 10, and $S_B$ is the surface area of the substrate 10.

Then, the content of the solder powder contained in the resin composition 13 is given by the following formula (2):

$$\text{Content of solder Powder (\% by volume)} = V_A/V_E = S_A/S_E \times 100 \quad (2)$$

Therefore, the content of the solder powder contained in the resin composition 13 is estimated by the following formula (3):

$$\text{Content of Solder Powder (\% by volume)} = (S_A/S_B \times 100) + \alpha \quad (3)$$

In the formula (3), α is a parameter for adjusting excess or shortage in quantity of the solder powder when it self-assembles onto the electrodes 11 of the substrate 10. The value of α can be determined in accordance with various conditions. Under an optimum condition, the value of α is zero.

For example, in a case where the resin composition 13 has a low fluidity (i.e., high viscosity) in the heating step, a free movement of the solder powder is impeded in the resin composition 13, which will lead to a lower proportion of the solder powder capable of self-assembling onto the electrodes. In this case, it is preferable to increase the quantity of the solder powder contained in the resin 13 (α has a positive value) to compensate for the shortage. The self-assembling of the solder powder may be affected by the effect of the convection additive and the wettability of the electrodes. In order to achieve simplification, parameter α can be determined on an experimental basis, for example by a trial-and-error method. In this way, α (α is parameter for adjusting excess or shortage in quantity of the solder powder when it self-assembles onto the electrodes) can be determined by various conditions. For example for the purpose of preventing the electrical insulating properties and the like from deteriorating, value of α is preferable set in the range of ±10% by volume, and more preferably in the range of ±5% by volume.

Figure 4:
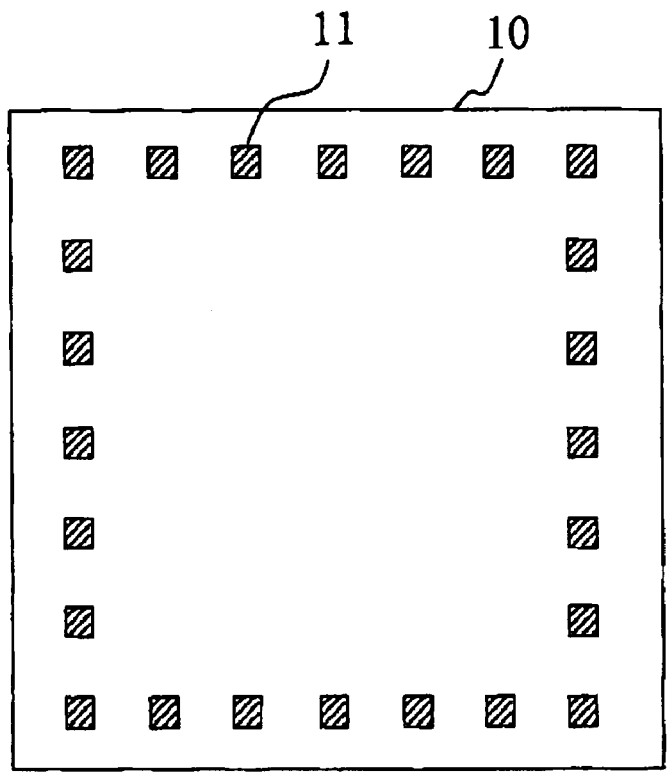
FIG. 4 shows a top plan view illustrating peripheral arrangement of electrodes according to the present invention.
Figure 5:
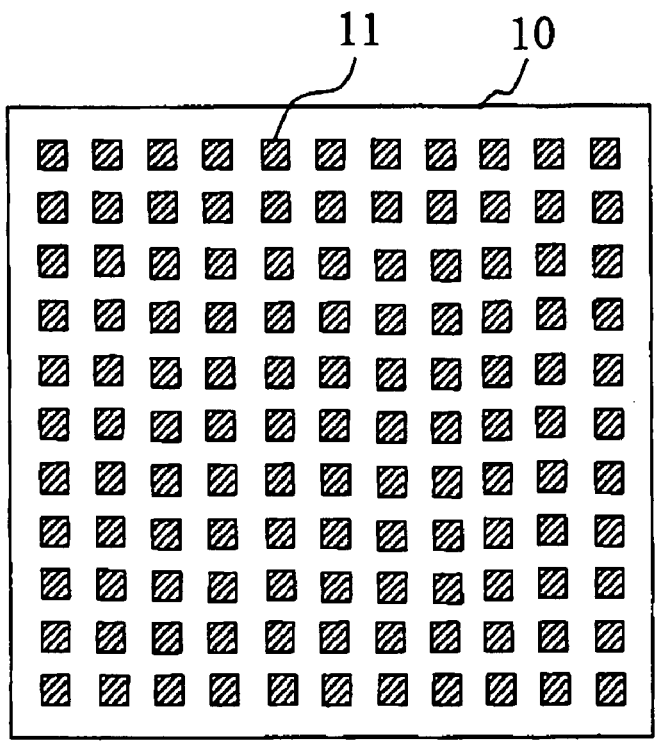
FIG. 5 shows a top plan view illustrating area array arrangement of electrodes according to the present invention.

The electrodes 11 may be disposed in various arrangement on the substrate 10. In the case of a typical arrangement of the electrodes 11 as shown in FIG. 4 and FIG. 5, the optimum content of the solder powder is determined by the formula (3) as follows:

In the case of the arrangement shown in FIG. 4 (Peripheral arrangement), the optimum content ranges between 0.5 and 5% by volume;

In the case of arrangement shown in FIG. 5 (Area array arrangement), the optimum content ranges between 15 and 30% by volume.

Thus, it can be concluded that it will be sufficient for the resin 13 (i.e., resin composition comprising the solder powder and the convection additive) to have a solder powder content of between 0.5 and 30% by volume, and preferably between 0.5 and 20% by volume in order to form the required bumps on the electrodes 11. It will be understood that such lower content of the solder powder is achieved due to the convective effect of the convection additive which is dispersed in the resin 13. Since the weight ratio of the solder powder and the resin or the convection additive is typically about 7, the content of between 0.5 and 30% by volume is approximately equivalent to a content of between 3 and 75% by weight.

[0095] In the embodiment of the present invention, the resin may contain a flux. In this case, the convection additive 12 contained in the resin is a solvent for the flux. Use of the flux achieves not only the effect of promoting the movement of the molten solder powder by the convection of the boiling flux solvent, but also the effect of removing the oxide film which is inevitably formed on the surface of the solder powder by the resin and/or the active component of the flux. It is in fact preferable to remove the oxide film from the surface of the solder powder before mixing the solder powder into the resin 13. However, even when such pretreatment cannot be carried out, the bumps having higher uniformity can be formed due to the synergetic effect of the flux.

The bump forming process of the present invention has an excellent feature in that a plurality of the bumps having high uniformity can be concurrently formed on the plurality of electrodes in a very short period of time. It will be noted that such feature is supposedly due to the high convective velocity of the boiling convection additive. This feature therefore provides a significant advantage in terms of manufacturing cost, when applied to mass production.

The resin which comprises the solder powder and the convection additive described above can be used as a bump forming resin composition in which case the resin composition is used for forming bumps on electrodes formed on a substrate or a semiconductor when the semiconductor chip is flip-chip mounted over the substrate. In this case, boiling point of the convection additive is preferably below the melting temperature of the solder powder, and the resin preferably comprises a thermosetting resin, a thermoplastic resin or a photo-setting resin (e.g., UV-curable resin) as the main component.

Second Embodiment

With reference to the drawings, second embodiment wherein the first embodiment is modified will be hereinafter described.

FIGS. 6(a) to 6(e) show the bump forming process wherein the flat plate that is to be brought into contact with the resin has a metal pattern on its surface.

Figure 6:
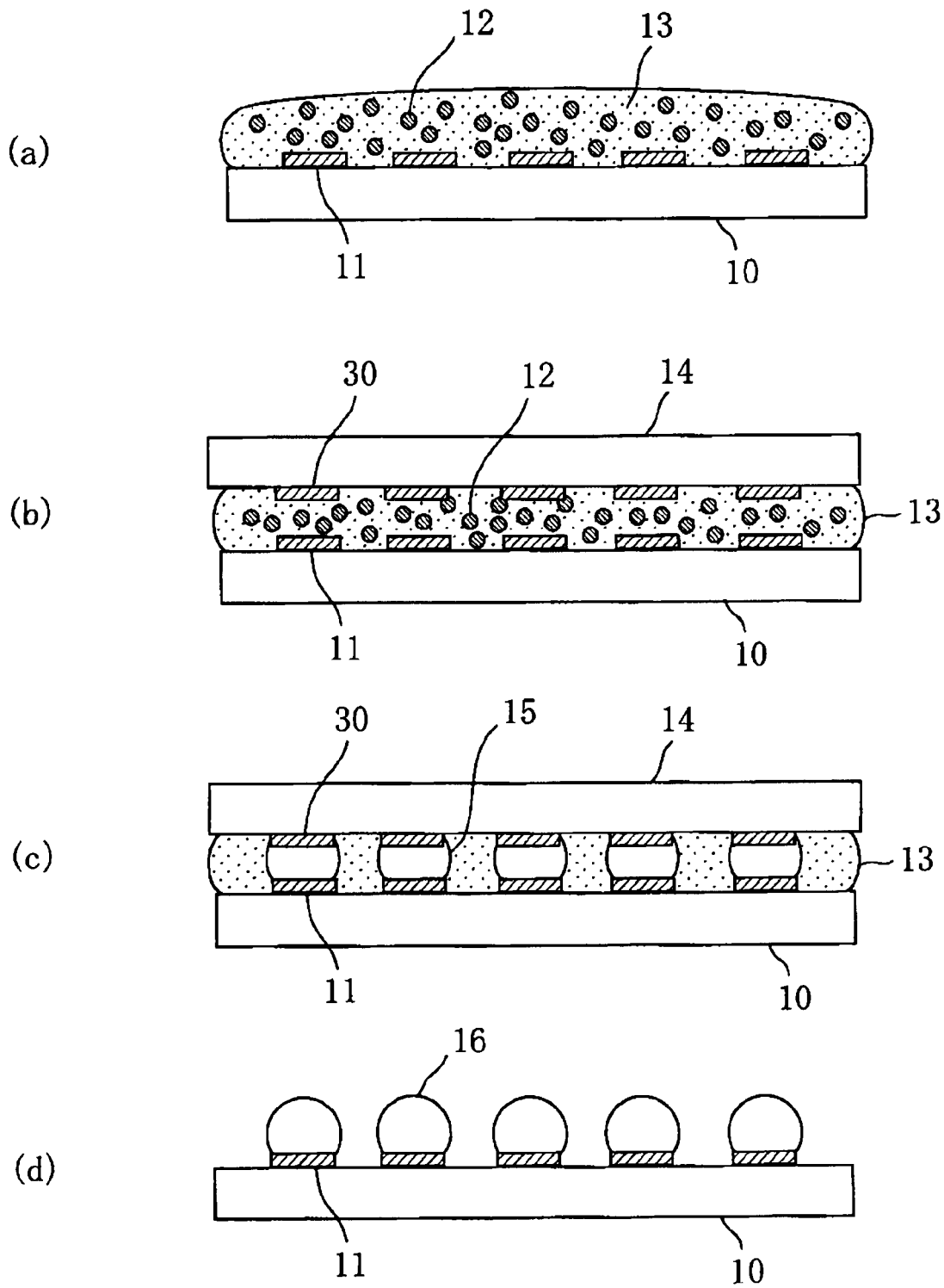
FIGS. 6(a) to 6(d) show cross-sectional views illustrating the steps in a process for forming bumps wherein a flat plate with electrical conductor pattern formed thereon is used.

First, as shown in FIG. 6(a), the resin 13 comprising the solder powder (not shown) and the convection additive 12 is applied onto the surface of the substrate 10 whereon a plurality of electrodes 11 are formed.

Next, the substrate 10 is heated to a temperature that enables the solder powder to melt while keeping the flat plate in contact with a surface of the supplied resin 13, as shown in FIG. 6(b). The flat plate 14 has a metal pattern 30 formed on its surface that is opposed to the substrate 10. Such metal pattern 30 has substantially the same configuration as that of a plurality of electrodes 11 formed on the substrate 10.

In this heating step, the convective flow of the boiling convection additive 12 promotes the self-assembling of the molten solder powder, and thus all the solder balls 15 which have grown are concurrently formed on the plurality of electrodes 11 in a self-alignment manner as shown in FIG. 6(c). Since the surface of the electrodes 11 has higher wettability to the molten solder powder than the surface of the substrate 10, the grown solder balls 15 are formed on electrodes 11 in a self-alignment manner. In this case, the grown solder balls 15 are formed also on the metal pattern 30 of the flat plate since such metal pattern 30 also has high wettability and is formed on the flat plate surface that is opposed to the electrodes 11. As a result, the selective formation of the bumps on the electrodes 11 is improved.

Finally, as shown in FIG. 6(d), the flat plate 14 is removed followed by removing the applied resin 13. As a result, the substrate 10 whereon the bumps 16 are formed on the plurality of electrodes 11 is obtained.

Figure 7:
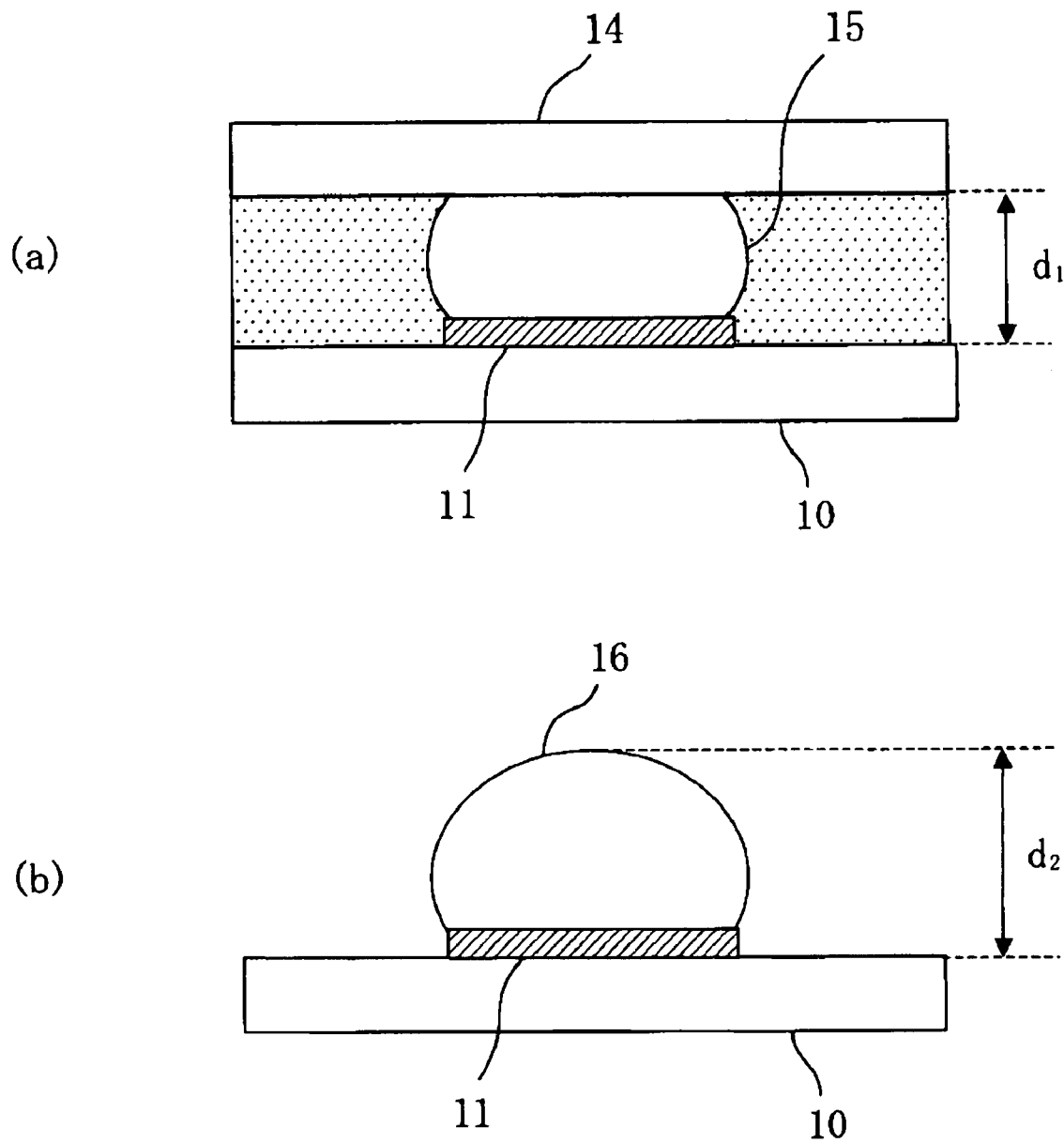
FIGS. 7(a) and 7(b) show cross-sectional views illustrating a method of controlling the height of bumps.
Figure 8:
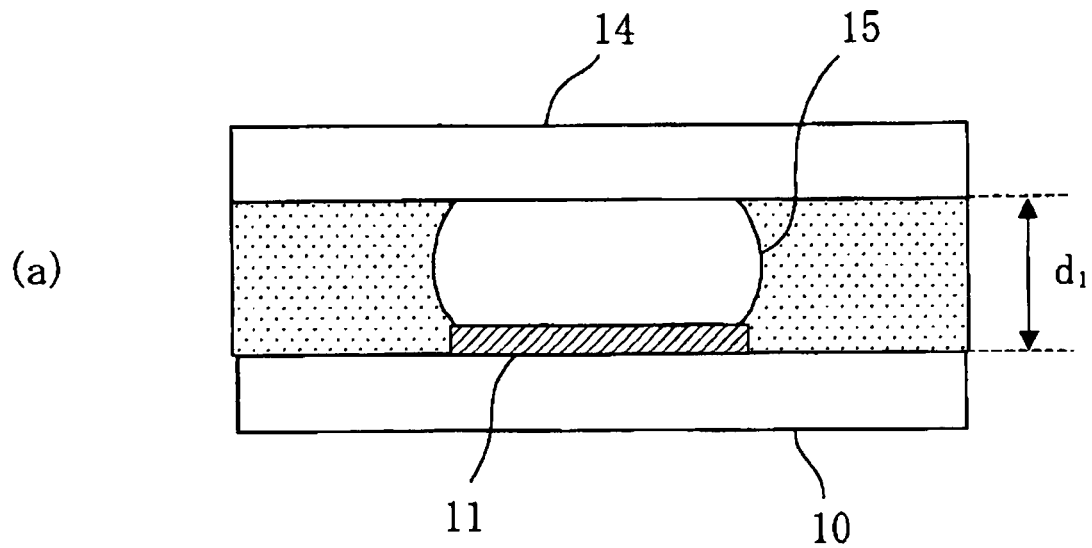
FIGS. 8(a) and 8(b) show cross-sectional views illustrating another method of controlling the height of bumps.
Figure 8:
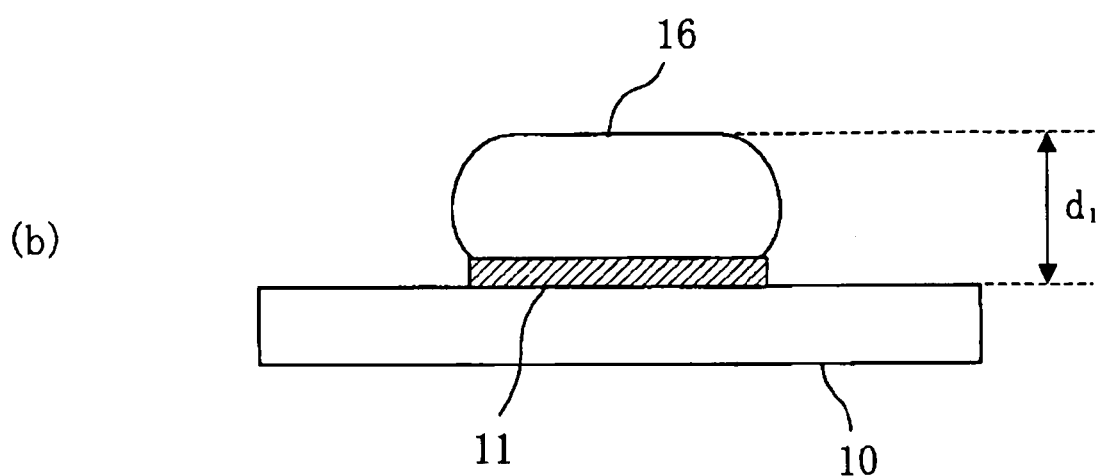

With reference to FIG. 7 and FIG. 8, a method of controlling the height of the bumps formed on the electrodes will now be described.

While the bump forming process of the present invention is characterized by the capability of forming the bumps having uniform height on the plurality of electrodes, the bumps must have certain height in order to ensure the connections between the electrodes when another substrate (for example, semiconductor chip) is mounted over the substrate having the bumps. However, as the surface area of the electrodes decreases, it becomes difficult to form a sufficient amount of bumps on the electrodes.

For solving the problems described above, the method illustrated in FIG. 7(a) and FIG. 7(b) is effective. When the substrate 10 is heated and the solder balls 15 are formed on the electrodes 11, the solder balls 15 are deformed with height d1 as shown in FIG. 7(a). Then, when the flat plate 14 is removed while the solder balls 15 are in molten state, the deformed solder balls 15 turn into spherical bumps 16 having height of d2 (>d1) due to the surface tension, as shown in FIG. 7(b). Thus the bumps having sufficient height can be obtained. The deformed solder balls 15 respectively have the same volume, and therefore the heights d2 of the bumps 16 become uniform.

In order to form the bumps having more uniform height, the method illustrated in FIG. 8(a) and FIG. 8(b) is effective. That is, the substrate 10 is heated so as to form the solder balls 15 on the electrodes 11 as shown in FIG. 8(a), followed by cooling of the substrate 10 and then removing the flat plate 14. It will be noted that the deformed solder balls 15 with height d1 are cooled down. Therefore, the solder balls 15 do not change in shape even when the flat plate 14 is removed, and thereby the deformed bumps 16 with height of d1 are formed on the electrodes 11. With this method, the heights of the bumps can be controlled by the distance between the substrates and the flat plate, and therefore the bumps having more uniform height can be obtained.

Figure 9:
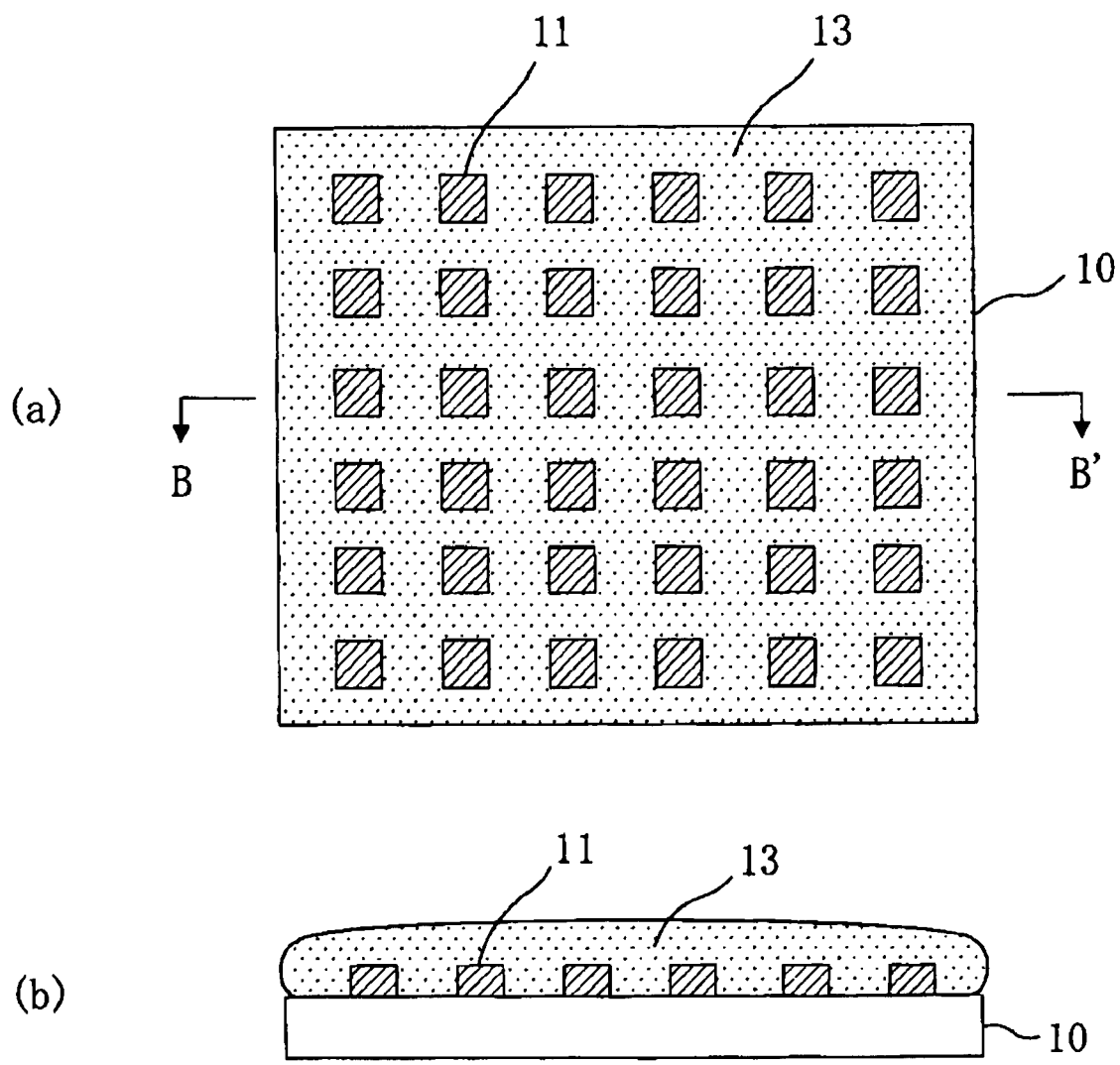
FIG. 9(a) shows a top plan view of a substrate wherein electrodes are disposed thereof in area array arrangement, and a resin is applied to such area array arrangement part.
FIG. 9(b) shows a cross-sectional view of the substrate of FIG. 9(a).
Figure 10:
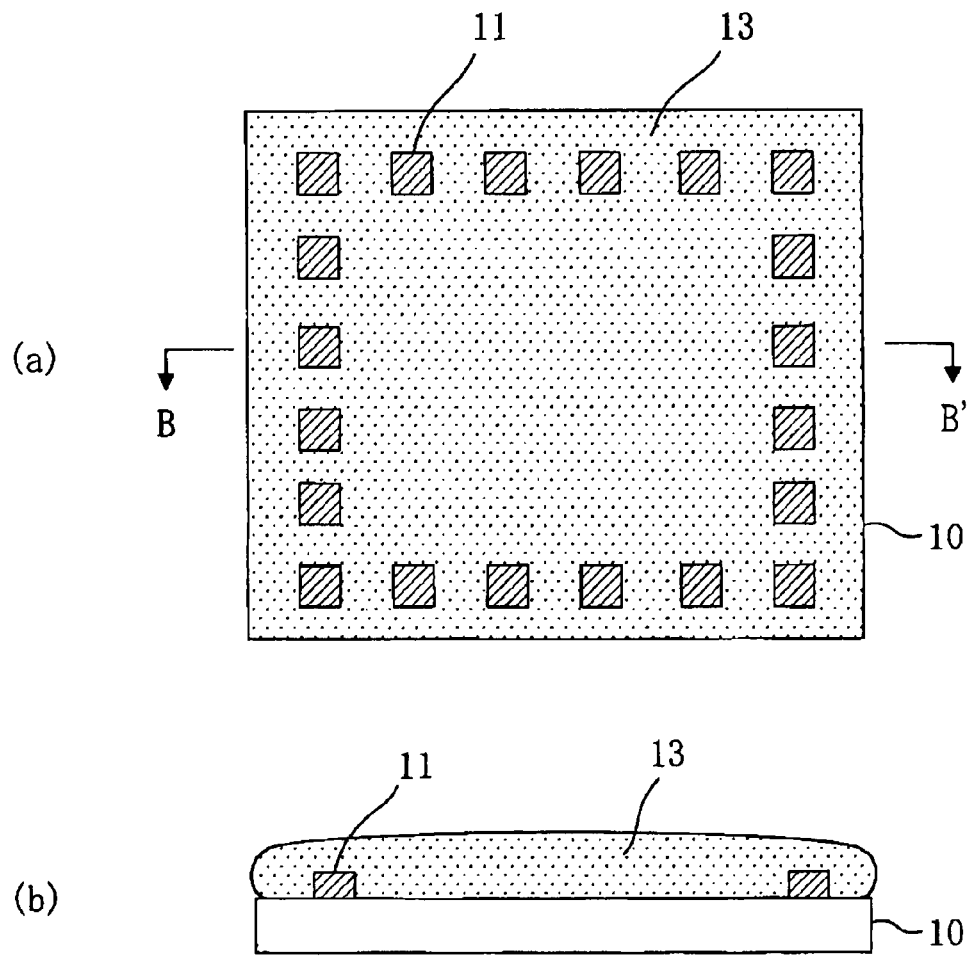
FIG. 10(a) shows a top plan view of a substrate wherein electrodes are disposed on the peripheral part thereof, and a resin is applied to such peripheral part.
FIG. 10(b) shows a cross-sectional view of the substrate of FIG. 10(a).

With reference to FIGS. 9 to 12, a method of supplying the resin onto the substrate will be hereinafter described FIG. 9(a) and FIG. 9(b) are respectively a top plan view and a sectional view of the substrate 10 illustrating the state of the resin 13 that has been supplied onto the substrate 10 having electrodes 11 formed thereon. The electrodes 11 are normally invisible, but are indicated with solid lines in FIG. 9(a) to help understanding. The electrodes 11 are arranged in the form of "array" on the substrate 10. When the substrate 10 is heated by the method as described above, satisfactory bumps are formed uniformly on the electrodes 11.

Figure 11:
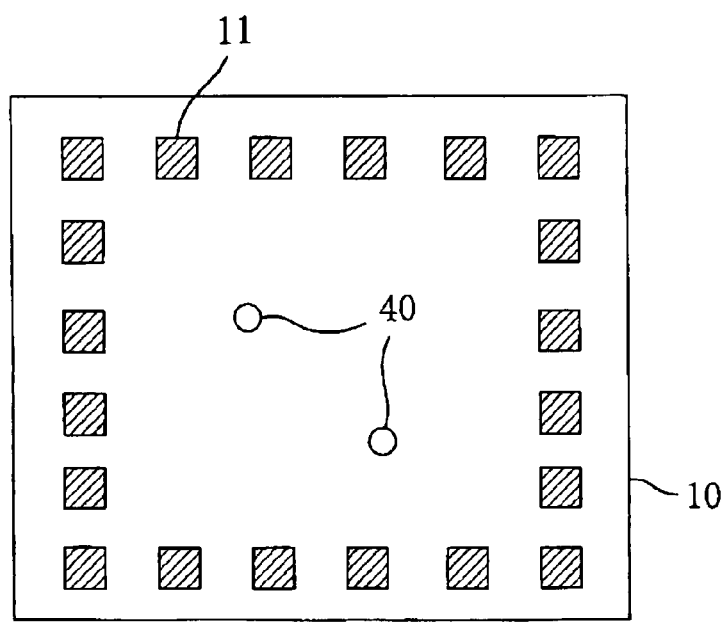
FIG. 11 shows a top plan view of a substrate showing the state of the residual solder powder left thereon after bumps are formed.

However, in case where the electrodes 11 are arranged along the periphery of the substrate 10 (i.e., peripheral arrangement) as shown in FIG. 10(a) and FIG. 10(b), the residual solder balls 40 may be left near the center of the substrate 10 as shown in FIG. 11 (when the bumps are formed on the electrodes 11 by supplying the resin 13 onto the substrate 10 followed by heating the substrate 10).

The reason for this is supposedly that the solder balls which has grown (due to the melting of the solder powder that is dispersed in the resin 13) near the center of the substrate 10 cannot move toward the electrodes 11 arranged along the periphery of the substrate 10.

The residual solder powder can be removed by removing the supplied resin 13 from the substrate after the bumps are formed. However, there is a possibility that the substrate mounting process uses the substrate having the supplied resin. It is therefore preferable not to allow the residual solder powder to exist in view of reliability.

Figure 12:
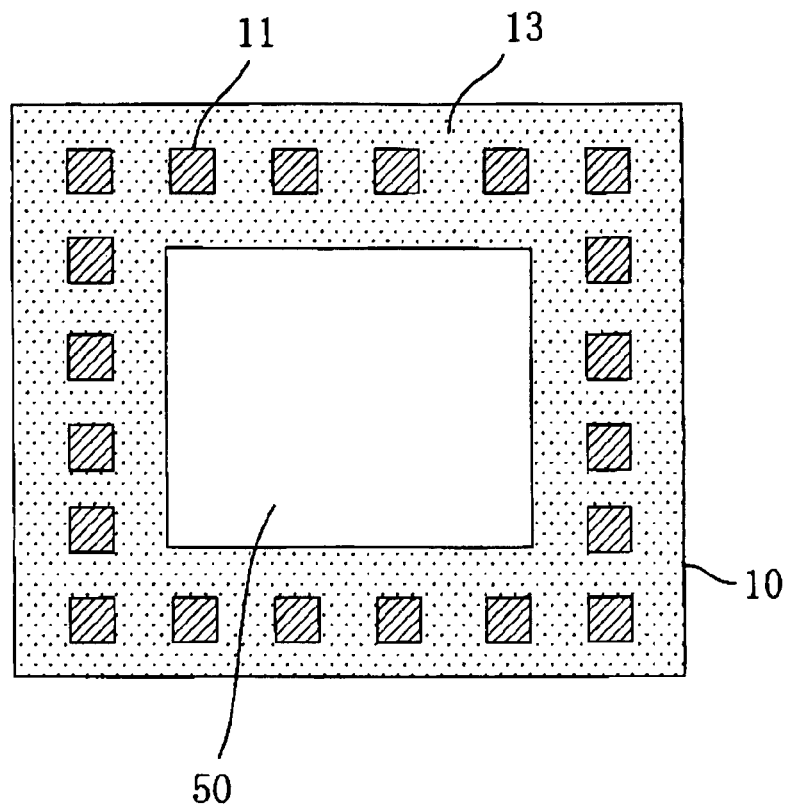
FIG. 12 shows a top plan view illustrating a method of applying resin to the substrate according to the present invention.

The residue of the solder powder can be avoided by supplying the resin 13 to cover the plurality of electrodes 11 formed on the substrate 10 as shown in FIG. 12. In this case, there is no supplied resin at the central region 50 of the substrate 10 where the electrodes 11 are not formed.

Next, a method of improving the selective formation of the bumps onto the electrodes 11 will be hereinafter described with reference to FIG. 13 and FIG. 14.

The method of selectively forming the molten solder powder onto the electrodes makes use of the difference in wettability of the solder powder. That is, the bumps are selectively formed on the electrodes when the electrodes have high wettability to the solder powder and the substrate has low wettability thereto.

Therefore, if the difference in the wettability can be made larger, improved selectivity of forming the bumps onto the electrodes can be obtained, which will lead to further improved uniformity of the bumps.

Figure 13:
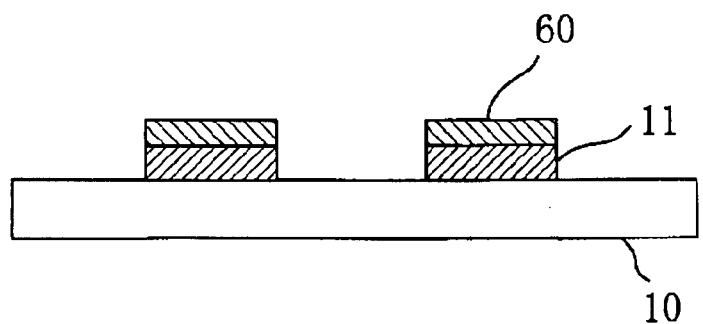
FIG. 13 shows a cross-sectional view illustrating a metal film formed on the electrode surface according to the present invention.

FIG. 13 shows an example in which a metal film 60 having high wettability to the solder powder is formed on the surfaces of the electrodes 11 provided on the substrate 10. While Cu or Au is usually used as the electrode material, it is possible to form the metal film of a material (for example, Sn-based alloy) which has high wettability to the solder powder, and thereby the improved selectivity of forming the bumps onto the electrodes can be obtained.

Figure 14:
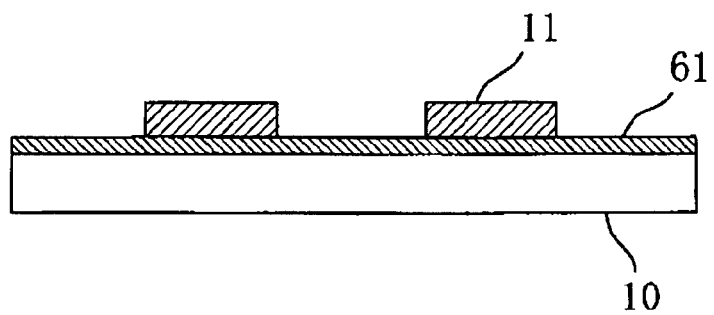
FIG. 14 shows a cross-sectional view illustrating a film formed on the substrate surface according to the present invention.

FIG. 14 shows an example in which a film 61 having low wettability to the solder powder is formed on the surface of the substrate 10. For example, the solder mask (solder resist) used for a printed circuit board has low wettability to the solder powder. Therefore, the improved selectivity of forming the bumps onto the electrodes can be obtained by forming the film of the solder mask on the substrate surface.

Figure 15:
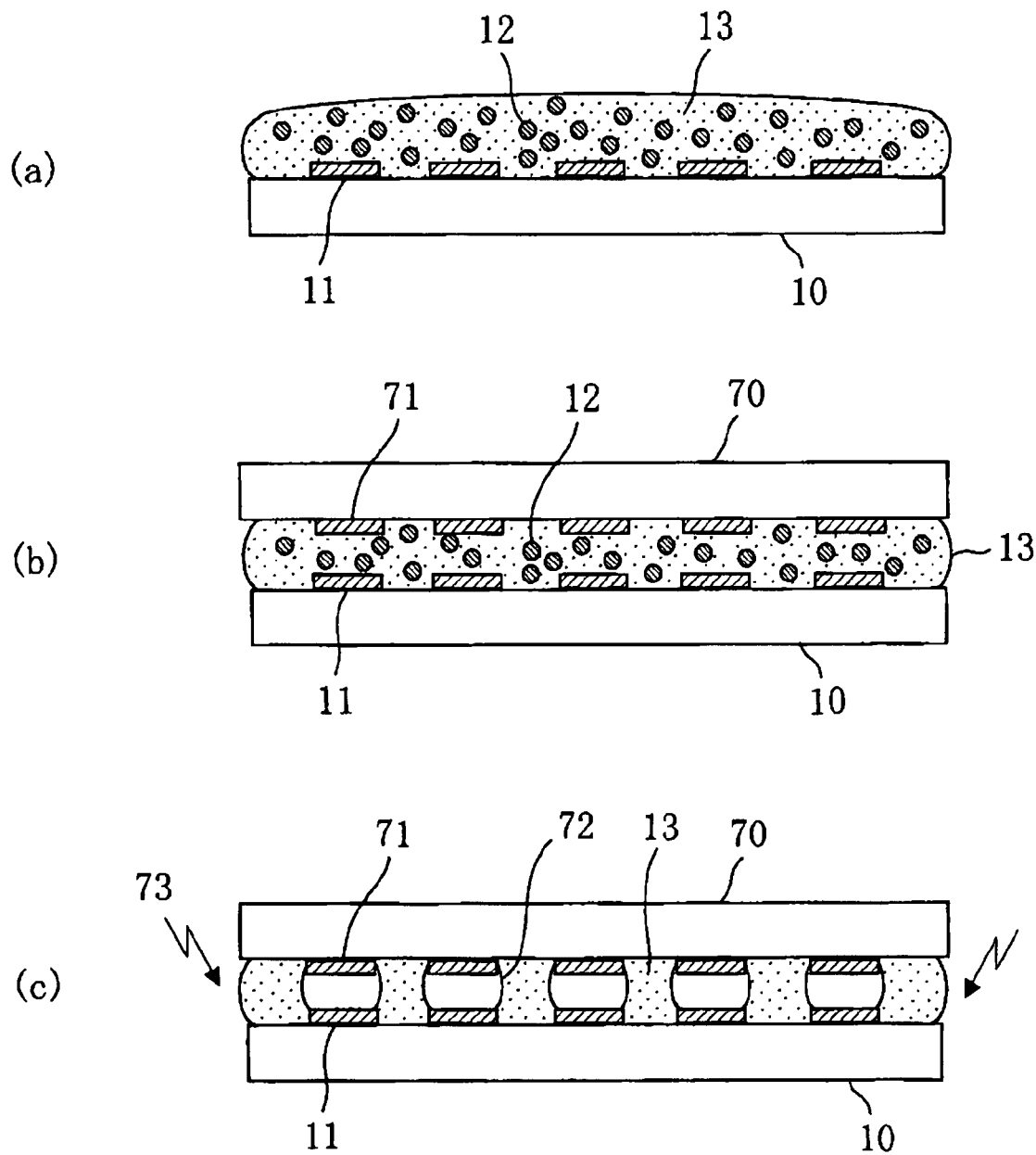
FIGS. 15(a) to 15(c) show cross-sectional views illustrating the steps in a flip chip mounting process according to the present invention.

With reference to FIGS. 15(a) to 15(c), an example of applying the bump forming process of the present invention to the flip chip mounting process wherein a semiconductor chip is mounted over a wiring substrate will now be described.

First, as shown in FIG. 15(a), the resin 13 comprising the solder powder (not shown) and the convection additive 12 is supplied onto the wiring substrate 10 having the electrodes 11 formed on the surface thereof. For example, the UV-curable resin may be used as the resin 13. The flux may be used as the convection additive 12.

Next, as shown in FIG. 15(b), the semiconductor chip 70 having electrode terminals 71 formed on the surface thereof is mounted on the supplied resin 13 in a such way that the electrode terminals 71 of the semiconductor chip 70 are opposed to the electrodes 11 of the wiring substrate 10. In this case, the semiconductor chip 70 serves as the flat plate 14 as described in relation to FIG. 1.

Then, as shown in FIG. 15(c), the wiring substrate 10 is heated so as to melt the solder powder, and thereby the solder balls 72 is formed through self-assembling into the region formed between the electrodes 11 and the electrode terminals 71. This results in electrical continuity established between the electrode terminals 71 of the semiconductor chip 70 and the electrodes 11 of the wiring substrate 10 via the solder balls 72. In this state, the UV-curable resin 13 is exposed to ultraviolet rays 73 so as to cure the resin 13, and thereby the flip chip mounting of semiconductor chip 70 can be completed. In this case, the resin 13 serves as an underfill material, and therefore it is possible to omit the step of supplying such underfill material.

A conventional flip chip mounting process using the common metal junction requires the following three steps:

1) the step of forming the solder bumps on the electrodes of wiring substrate;

2) the step of mounting the semiconductor chip over the wiring substrate and making connection between the electrodes via the bumps by solder reflow; and 3) the step of pouring the underfill material between the wiring substrate and the semiconductor chip so as to secure the semiconductor chip to the wiring substrate.

By contrast, in the flip chip mounting process illustrated in FIGS. 15(a) to 15(c), the formation of the solder bumps and connection between the electrodes are simultaneously carried out as well as the resin 13 serves as the underfill material. As a result, the objects of the three steps described above can be achieved by the single step of forming the solder bumps, and thereby the manufacturing steps can be greatly reduced and the manufacturing cost can be also reduced.

While the present invention has been described by way of preferred embodiments, the present invention is not limited to these descriptions and thus various modifications can be made.

The present invention as described above includes the following aspects:

The first aspect: a process for forming bumps on electrodes, comprising the steps of:

(1) preparing a substrate on which a plurality of electrodes are formed;

(2) supplying a resin comprising solder powder and a convection additive onto the substrate; and (3) heating the substrate up to a temperature that enables the solder powder to melt.

The second aspect: the process according to the first aspect, wherein the step (3) of heating the substrate is carried out at a temperature that is above a boiling point of the convection additive.

The third aspect: the process according to the second aspect, wherein the convection additive boils and convects within the resin in the step (3).

The fourth aspect: the process according to any one of the first to the third aspects, wherein the solder powder that is in molten state convects within the resin in the step (3).

The fifth aspect: the process according to any one of the first to the fourth aspects, wherein the convection additive is at least one material selected from the group consisting of solvent, glycerin, wax, isopropyl alcohol, butyl acetate, butyl carbitol and ethylene glycol.

The sixth aspect: the process according to any one of the first to the fifth aspects, wherein the solder powder consists of particles having approximately the same size.

The seventh aspect: the process according to any one of the first to the sixth aspects, wherein the substrate is heated while keeping a flat plate in contact with a surface of the supplied resin in the step (3).

The eighth aspect: the process according to the seventh aspect, wherein the flat plate is hold so as to form a constant gap width between the electrodes of the substrate and the flat plate.

The ninth aspect: the process according to the eighth aspect, wherein the constant gap width is larger than particle size of the solder powder in the step (3).

The tenth aspect: the process according to the seventh aspect, wherein the substrate is heated while pressing the resin by applying a constant pressure to the flat plate in the step (3).

The eleventh aspect: the process according to any one of the seventh to tenth aspects, wherein the convection additive boils and migrates as vapor to the outside from a periphery of a gap formed between the substrate and the flat plate in the step (3).

The twelfth aspect: the process according to any one of the first to the eleventh aspects, wherein a metal pattern is formed on a surface of the flat plate, the surface being opposed to the substrate, and the metal pattern has substantially the same configuration as that of the plurality of electrodes formed on the substrate.

The thirteenth aspect: the process according to any one of the seventh to the twelfth aspects, wherein, during the step (3), the flat plate is removed after the bumps are formed on the electrodes.

The fourteenth aspect: the process according to the thirteenth aspect, wherein the flat plate is removed without cooling the substrate so as to provide the bumps having height larger than a distance between the electrodes and the flat plate.

The fifteenth aspect: the process according to any one of the seventh to the thirteenth aspects, further comprising a step of cooling the substrate, such step being performed after the step (3), wherein the substrate is cooled, followed by moving the flat plate away from the surface of the supplied resin.

The sixteenth aspect: the process according to any one of the first to fifteenth aspects, further comprising a step of cooling the substrate, such step being performed after the step (3), wherein the substrate is cooled, followed by removing the resin.

The seventeenth aspect: the process according to any one of the first to the sixteenth aspects, wherein the step (3) of heating the substrate is carried out at a temperature that enables viscosity of the resin to decrease.

The eighteenth aspect: the process according to any one of the first to the seventeenth aspects, wherein the resin is supplied so as to cover at least the plurality of electrodes in the step (1), and the solder powder melts and self-assembles onto the electrodes in the step (3), and thereby the bumps are formed only on the electrodes.

The nineteenth aspect: the process according to any one of the first to the eighteenth aspects, wherein a metal film having high wettability to the solder powder is formed on surfaces of the plurality of electrodes.

The twentieth aspect: the process according to any one of the first to the nineteenth aspects, wherein a film having low wettability to the solder powder is formed on a surface of the substrate, such surface being not provided with the plurality of electrodes.

The twenty-first aspect: the process according to any one of the seventh to the fifteenth aspects, wherein the flat plate is made of material having low wettability to the solder powder.

The twenty-second aspect: the process according to any one of the first to the twenty-first aspects, wherein the solder powder is made of lead-free solder material.

The twenty-third aspect: the process according to any one of the first to the twenty-second aspects, wherein the content of the solder powder contained in the resin ranges from 0.5 to 30% by volume.

The twenty-fourth aspect: a solder bump formed on a plurality of electrodes, such electrodes being formed on a surface of a substrate, wherein the solder bump is obtained by supplying a resin comprising solder powder and a convection additive onto the substrate, followed by allowing the solder powder to melt and self-assemble onto the electrodes.

The twenty-fifth aspect: the solder bump according to the twenty-fourth aspect, wherein the substrate is a wiring substrate or a semiconductor chip.

The twenty-sixth aspect: the solder bump according to the twenty-fourth or the twenty-fifth aspect, wherein the solder powder is made of lead-free solder material.

The twenty-seventh aspect: a resin composition used for forming a bump on an electrode of a substrate or a semiconductor chip, comprising a resin which comprises solder powder and a convection additive.

The twenty-eighth aspect: the resin composition according to the twenty-seventh aspect, wherein a boiling point of the convection additive is below a melting point of the solder powder.

The twenty-ninth aspect: the resin composition according to the twenty-seventh or the twenty-eighth aspect, wherein the convection additive is at least one material selected from the group consisting of solvent, glycerin, wax, isopropyl alcohol, butyl acetate, butyl carbitol and ethylene glycol.

The thirtieth aspect: the resin composition according to any one of the twenty-seventh to the twenty-ninth aspects, comprising thermosetting resin, thermoplastic resin or photo-setting resin as a major component.

INDUSTRIAL APPLICABILITY

The present invention provides a process for forming a large number of fine bumps uniformly with high productivity.

CROSS REFERENCE TO RELATED PATENT APPLICATIONS

The present application claims the rights of priority of Japanese Patent Application No. 2004-257206 (filed on Sep. 3, 2004, the title of the invention: "PROCESS FOR FORMING BUMPS AND SOLDER BUMP"); and priority of Japanese Patent Application No. 2005-091336 (filed on Mar. 28, 2005, the title of the invention: "PROCESS FOR FORMING BUMPS AND SOLDER BUMP"), the disclosures of which are all incorporated herein by reference.

The invention claimed is:

1. A process for forming bumps on electrodes, the process comprising:
   (1) preparing a substrate on which a plurality of electrodes are formed;
   (2) supplying a resin comprising solder powder and a convection additive onto the substrate; and
   (3) heating the substrate up to a temperature that causes the solder powder to melt and the convection additive to boil so that the convection additive transforms to a gas state within the resin, and the convection additive in the gas state convects within the resin so as to cause the solder powder to assemble at the electrodes.

2. The process according to claim 1, wherein the step (3) of heating the substrate is carried out at a temperature that is above a boiling point of the convection additive.

3. The process according to claim 1, wherein the convection additive is at least one material selected from the group consisting of solvent, glycerin, wax, isopropyl alcohol, butyl acetate, butyl carbitol and ethylene glycol.

4. The process according to claim 1, wherein the solder powder consists of particles having approximately the same size.

5. The process according to claim 1, wherein the substrate is heated while keeping a flat plate in contact with a surface of the supplied resin in the step (3).

6. The process according to claim 5, wherein the flat plate is held so as to form a constant gap width between the electrodes of the substrate and the flat plate.

7. The process according to claim 6, wherein the constant gap width is larger than the particle size of the solder powder in the step (3).

8. The process according to claim 5, wherein the substrate is heated while pressing the resin by applying a constant pressure to the flat plate in the step (3).

9. The process according to claim 5, wherein the convection additive boils and migrates as vapor to the outside from a periphery of a gap formed between the substrate and the flat plate in the step (3).

10. The process according to claim 1, wherein a metal pattern is formed on a surface of the flat plate, the surface being opposed to the substrate, and the metal pattern has substantially the same configuration as that of the plurality of electrodes formed on the substrate.

11. The process according to claim 5, wherein, in the step (3), the flat plate is removed after the bumps are formed on the electrodes.

12. The process according to claim 11, wherein the flat plate is removed without cooling the substrate so as to provide the bumps having a height that is larger than a distance between the electrodes and the flat plate.

13. The process according to claim 5, further comprising cooling the substrate after the step (3), wherein the substrate is cooled, followed by moving the flat plate away from the surface of the supplied resin.

14. The process according to claim 1, further comprising cooling the substrate after the step (3), wherein the substrate is cooled, followed by removing the resin.

15. The process according to claim 1, wherein the step (3) of heating the substrate is carried out at a temperature that enables the viscosity of the resin to decrease.

16. The process according to claim 1, wherein the resin is supplied so as to cover at least the plurality of electrodes in the step (1), and the solder powder melts and self-assembles onto the electrodes in the step (3), and thereby the bumps are formed only on the electrodes.

17. The process according to claim 1, wherein a metal film having high wettability to the solder powder is formed on surfaces of the plurality of electrodes.

18. The process according to claim 1, wherein a film having low wettability to the solder powder is formed on a surface of the substrate that is not provided with the plurality of electrodes.

19. The process according to claim 5, wherein the flat plate is made of material having low wettability to the solder powder.

20. The process according to claim 1, wherein the solder powder is made of lead-free solder material.

21. The process according to claim 1, wherein the content of the solder powder contained in the resin ranges from 0.5 to 30% by volume.

* * * * *